US008559229B2

(12) United States Patent
Kim et al.

(10) Patent No.: US 8,559,229 B2
(45) Date of Patent: Oct. 15, 2013

(54) FLASH MEMORY DEVICE AND WORDLINE VOLTAGE GENERATING METHOD THEREOF

(75) Inventors: Seung-Gum Kim, Hwaseong-si (KR); Ohsuk Kwon, Seoul (KR); Dongku Kang, Yongin-si (KR); Tae-Young Kim, Seoul (KR); Jaewoo Im, Hwaseong-si (KR); Moosung Kim, Yongin-si (KR); Jae-Duk Yu, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 70 days.

(21) Appl. No.: 13/246,040

(22) Filed: Sep. 27, 2011

(65) Prior Publication Data

US 2012/0081957 A1 Apr. 5, 2012

Related U.S. Application Data

(60) Provisional application No. 61/447,136, filed on Feb. 28, 2011.

(30) Foreign Application Priority Data

Sep. 30, 2010 (KR) .................. 10-2010-0095406
Dec. 2, 2010 (KR) .................. 10-2010-0130812
Jan. 4, 2011 (KR) .................. 10-2011-0000609
Jan. 5, 2011 (KR) .................. 10-2011-0001010

(51) Int. Cl.
*G11C 11/34* (2006.01)
(52) U.S. Cl.
USPC .................... 365/185.2; 365/185.24
(58) Field of Classification Search
USPC .......................... 365/185.2, 185.24
See application file for complete search history.

(56) References Cited

U.S. PATENT DOCUMENTS

| 5,986,947 | A | * | 11/1999 | Choi et al. | ............... 365/189.11 |
| 6,026,014 | A | | 2/2000 | Sato et al. | |
| 7,593,259 | B2 | | 9/2009 | Kim | |
| 2007/0147141 | A1 | * | 6/2007 | Shibata | ..................... 365/189.09 |
| 2008/0266968 | A1 | * | 10/2008 | Mori | ........................ 365/185.18 |
| 2009/0244969 | A1 | * | 10/2009 | Maejima | .................. 365/185.03 |

FOREIGN PATENT DOCUMENTS

| JP | 10-233096 | 9/1998 |
| JP | 2006-128594 | 5/2006 |
| JP | 2010-503944 | 2/2010 |
| KR | 1020010061457 | 7/2001 |
| KR | 1020080030214 A | 4/2008 |
| KR | 10-2009-0048102 A | 5/2009 |
| KR | 10-2009-0074763 A | 7/2009 |
| WO | 2008/031217 A1 | 3/2008 |

\* cited by examiner

*Primary Examiner* — Michael Tran
(74) *Attorney, Agent, or Firm* — Volentine & Whitt, PLLC

(57) ABSTRACT

A word line voltage generating method of a flash memory which includes generating a program voltage using a positive voltage generator; generating a plurality of negative program verification voltages corresponding to a plurality of negative data states using a negative voltage generator; and generating at least one or more program verification voltages corresponding to at least one or more states using the positive voltage generator. Generating a plurality of negative program verification voltages includes generating a first negative verification voltage; discharging an output of the negative voltage generator to become higher than the first negative verification voltage; and performing a negative charge pumping operation until an output of the negative voltage generator reaches a second negative verification voltage level.

55 Claims, 25 Drawing Sheets

FLASH MEMORY DEVICE AND WORDLINE VOLTAGE GENERATING METHOD THEREOF

CROSS-REFERENCE TO RELATED APPLICATIONS

A claim of priority under 35 U.S.C §119 is made to Korean Patent Application No. 10-2010-0095406 filed Sep. 30, 2010, Korean Patent Application No. 10-2010-0130812, filed Dec. 20, 2011, Korean Patent Application No. 10-2011-00000609 filed Jan. 4, 2011, and Korean Patent Application No. 10-2010-0001010 filed Jan. 5, 2011, and U.S. Provisional Patent Application Ser. No. 61/447,136 filed Feb. 28, 2011, the entirety of which are incorporated by reference herein.

BACKGROUND

The inventive concepts described herein relate to a semiconductor memory device, and more particularly, relate to a flash memory device and a word line voltage generating method thereof.

Semiconductor memory devices may be classified into volatile semiconductor memory devices and nonvolatile semiconductor memory devices. Volatile semiconductor memory devices may perform read and write operations at high speed, while contents stored therein may be lost when the devices are powered-off. Nonvolatile semiconductor memory devices may retain contents stored therein even when powered-off. For this reason, nonvolatile semiconductor memory devices may be used to store contents to be retained regardless of whether the devices are powered on or off.

Nonvolatile semiconductor memory devices may include a mask read-only memory (MROM), a programmable ROM (PROM), an erasable programmable ROM (EPROM), an electrically erasable programmable ROM (EEPROM), etc.

A flash memory device may be a typical nonvolatile memory device. A flash memory device may be widely used as the voice and image storing media of information apparatuses such as a computer, a cellular phone, a PDA, a digital camera, a camcorder, a voice recorder, an MP3 player, a handheld PC, a game machine, a facsimile, a scanner, a printer, etc. Such information apparatuses may be used as a host, respectively.

As high integration memory devices have recently become increasingly required, multi-bit memory devices storing multi-bit data in a memory cell have become more common.

SUMMARY

In an embodiment of the inventive concept, a word line voltage generating method of a flash memory includes generating a program voltage using a positive voltage generator; generating a plurality of negative program verification voltages corresponding to a plurality of negative data states using a negative voltage generator; and generating at least one or more program verification voltages corresponding to at least one or more states using the positive voltage generator, wherein the generating a plurality of negative program verification voltages includes generating a first negative verification voltage, discharging an output of the negative voltage generator to become higher than the first negative verification voltage, and performing a negative charge pumping operation until an output of the negative voltage generator reaches a second negative verification voltage level.

In another embodiment of the inventive concept, a word line voltage generating method of a flash memory includes generating a plurality of negative read voltages corresponding to a plurality of negative data states using a negative voltage generator; and generating at least one or more positive read voltages corresponding to at least one or more positive data states using a low voltage generator, wherein the generating a plurality of negative read voltages includes generating a first negative read voltage, discharging an output of the negative voltage generator to become higher than the first negative read voltage, and performing a negative charge pumping operation until an output of the negative voltage generator reaches a second negative read voltage level.

In still another embodiment of the inventive concept, a word line voltage generating method of a flash memory includes generating a first negative voltage via a negative charge pumping of a negative voltage pump; discharging an output of the negative voltage pump; comparing the discharge output of the negative voltage pump with a second negative voltage that is a target negative voltage; and if the discharge output of the negative voltage pump is higher than the second negative voltage, activating the negative charge pumping to generate the second negative voltage, wherein the negative charge pumping of the negative voltage pump is activated until the discharge output of the negative voltage pump is identical to or lower than the second negative voltage.

In still another embodiment of the inventive concept, a flash memory device includes a memory cell array including a plurality of flash memory cells disposed at intersections of a plurality of word lines and a plurality of bit lines; a voltage generating unit configured to generate a plurality of word line voltages to be applied to the word lines; and a control logic configured to control a voltage generating operation of the voltage generating unit, wherein the voltage generating unit includes a negative voltage generator which is configured to generate a first negative voltage, to discharge the first negative voltage, and to perform a negative charge pumping until a second negative voltage higher than the first negative voltage is generated.

In another embodiment of the inventive concept, a flash memory device includes a memory cell array including a plurality of flash memory cells disposed at intersections of a plurality of word lines and a plurality of bit lines; a positive voltage generator configured to generate a positive high voltage to be applied to a selected word line and at least one or more positive low voltages corresponding to at least one or more data states; a negative voltage generator configured to generate a plurality of negative voltages corresponding to a plurality of negative data states and to be applied to the selected word line; and a control logic configured to control the positive voltage generator and the negative voltage generator, wherein when a second negative voltage is generated after generation of a first negative voltage lower than the second negative voltage, the negative voltage generator discharges an output of the negative voltage generator so as to become higher than the second negative voltage, and performs a negative charge pumping until an output of the negative voltage generator reaches the second negative voltage.

In still another embodiment of the inventive concept, a data storage device includes a plurality of flash memories connected with a plurality of channels; and a controller configured to control read, write, and erase operations of each of the plurality of flash memories via corresponding channels, wherein each of the plurality of flash memories includes a memory cell array including a plurality of flash memory cells disposed at intersections of a plurality of word lines and a plurality of bit lines, a voltage generating unit configured to generate a plurality of word line voltages to be applied to the word lines, and a control logic configured to control a voltage generating operation of the voltage generating unit, wherein the voltage generating unit includes a negative voltage generator which is configured to generate a first negative voltage, to discharge the first negative voltage, and to generate a second negative voltage via a negative charge pumping.

In still another embodiment of the inventive concept, a word line voltage generating method of a flash memory device includes generating a program voltage using a positive voltage generator; generating a plurality of negative program verification voltages using a negative voltage generator; and generating at least one or more positive program verification voltages using the positive voltage generator, wherein the generating a plurality of negative program verification voltages includes generating a negative program verification voltage having a high level prior to a negative program verification voltage having a low level.

In another embodiment of the inventive concept, a word line voltage generating method of a flash memory device includes generating a program voltage; generating a first negative program verification voltage; generating at least one positive program verification voltage corresponding to at least one data state; and generating a second negative program verification voltage.

In still another embodiment of the inventive concept, a flash memory device includes a memory cell array including a plurality of flash memory cells disposed at intersections of a plurality of word lines and a plurality of bit lines; a voltage generating unit configured to generate a plurality of word line voltages to be applied to the word lines; and a control logic configured to control a voltage generating operation of the voltage generating unit, wherein the voltage generating unit generates a plurality of negative word line voltages sequentially from a negative word line voltage having a highest level to a negative word line voltage having a lowest level.

A flash memory device according to another embodiment of the inventive concept includes a memory cell array including a plurality of flash memory cells disposed at intersections of a plurality of word lines and a plurality of bit lines; a voltage generating unit configured to generate a plurality of word line voltages to be applied to the word lines; and a control logic configured to control a voltage generating operation of the voltage generating unit, wherein the voltage generating unit generates a negative word line voltage and a positive word line voltage in turn during a program verify operation.

A word line voltage generating method of a flash memory according to still another embodiment of the inventive concept includes generating a first negative verification voltage via a negative charge pumping of a negative voltage generator; discharging an output of the negative voltage generator during a first discharge time; and generating a second negative verification voltage via a negative charge pumping of the negative voltage generator after the first discharge time, wherein the first discharge time is determined according to a voltage difference between the first negative verification voltage and the second negative verification voltage.

In still another embodiment of the inventive concept, a verification voltage generating method of a flash memory device which includes a negative voltage generator, includes generating a first negative verification voltage via the negative voltage generator; discharging an output of the negative voltage generator during a first discharge time; generating a second negative verification voltage higher than the first negative verification voltage via the negative voltage generator; discharging an output of the negative voltage generator during a second discharge time; and generating a third negative verification voltage higher than the second negative verification voltage via the negative voltage generator;

In a further embodiment of the inventive concept, a verification voltage generating method of a flash memory includes generating a first negative verification voltage via a negative charge pumping operation of a negative voltage generator; and generating a second negative verification voltage higher than the first negative verification voltage without the negative charge pumping operation, wherein the second negative verification voltage is set up according to a discharge of the negative voltage generator.

According to still another embodiment of the inventive concept, a verification voltage generating method of a flash memory device which includes a positive voltage generator and a negative voltage generator, includes generating a negative verification voltage using the negative voltage generator; discharging an output of the negative voltage generator to a ground level; and generating a positive verification voltage via a positive charge pumping operation of the positive voltage generator.

In still another embodiment of the inventive concept, a flash memory device includes a memory cell array including a plurality of flash memory cells disposed at intersections of a plurality of word lines and a plurality of bit lines; a voltage generating unit configured to generate a plurality of word line voltages to be applied to the word lines; and a control logic configured to control a voltage generating operation of the voltage generating unit, wherein the voltage generating unit discharges a first negative voltage during a discharge time and then generates a second negative voltage higher than the first negative voltage, and wherein the discharge time is determined according to a voltage difference between the first negative voltage and the second negative voltage.

In a further embodiment of the inventive concept, a data storage device includes a plurality of flash memories connected with a plurality of channels; and a controller configured to control read, write, and erase operations of each of the plurality of flash memories via corresponding channels, wherein each of the plurality of flash memories includes a memory cell array including a plurality of flash memory cells disposed at intersections of a plurality of word lines and a plurality of bit lines, a voltage generating unit configured to generate a plurality of word line voltages to be applied to the word lines, and a control logic configured to control a voltage generating operation of the voltage generating unit, wherein the voltage generating unit includes a negative voltage generator, and wherein when a first negative voltage is generated and then a second negative voltage higher than the first negative voltage is generated, the negative voltage generator discharges an output terminal of the voltage generating unit during a discharge time determined according to a voltage difference between the first negative voltage and the second negative voltage, and then generates the second negative voltage.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
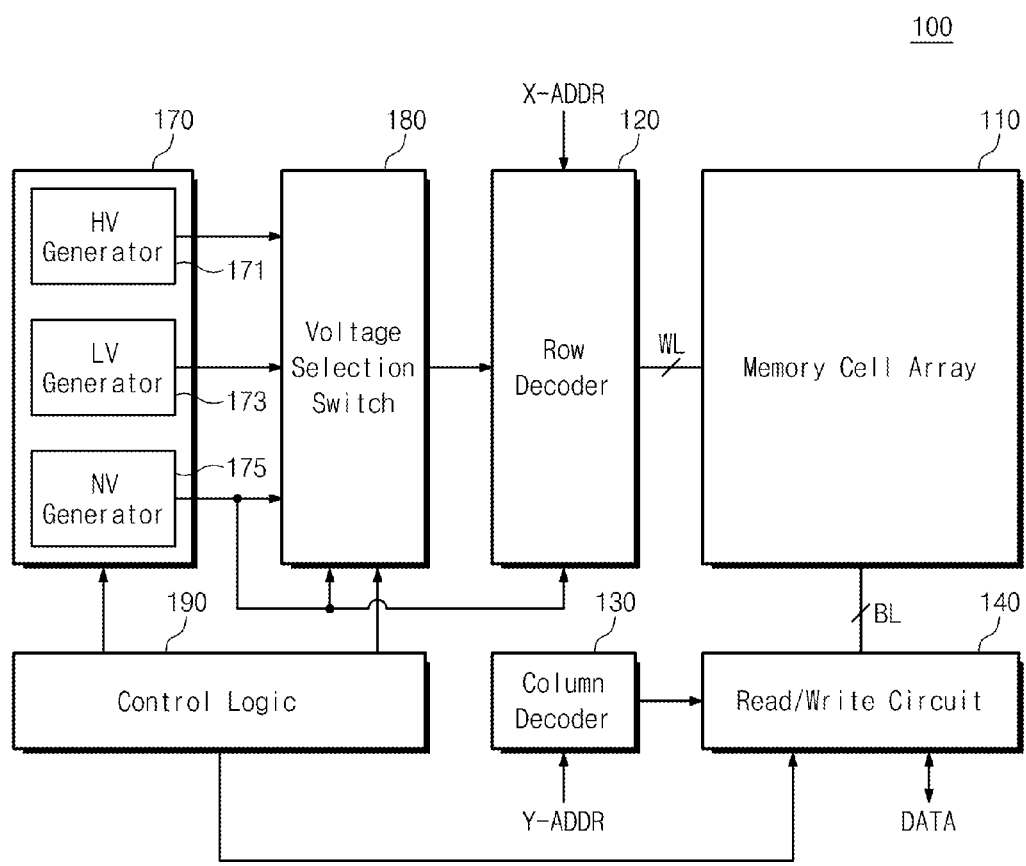
FIG. 1 is a block diagram illustrating a flash memory device according to an exemplary embodiment of the inventive concept.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 2:
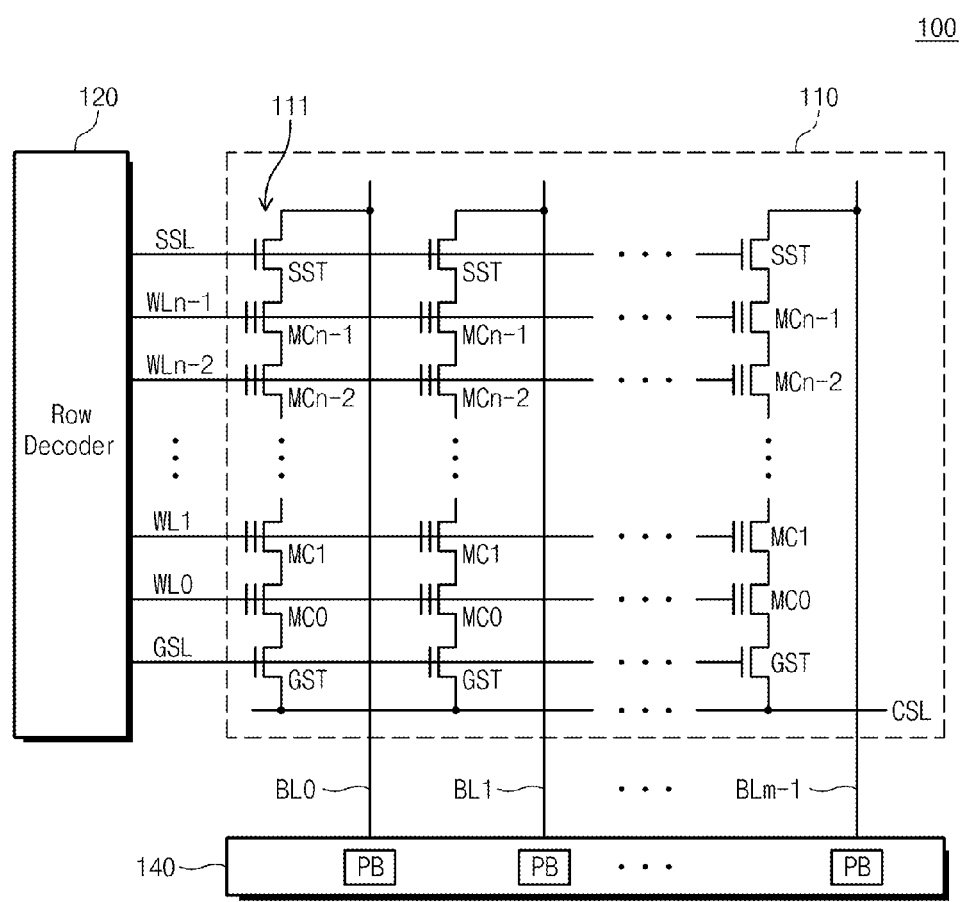
FIG. 2 is a diagram illustrating a memory cell array shown in FIG. 1 according to an exemplary embodiment of the inventive concept.

FIG. 1 is a block diagram illustrating a flash memory device according to an exemplary embodiment of the inventive concept. FIG. 2 is a diagram illustrating a memory cell array in FIG. 1 according to an exemplary embodiment of the inventive concept.

Referring to FIG. 1, a flash memory device 100 may include a memory cell array 110, a row decoder 120, a column decoder 130, a read/write circuit 140, a voltage generating unit 170, a voltage selection switch 180, and control logic 190.

The memory cell array 110 may be connected with the row decoder 120 via word lines WL and with the read/write circuit 130 via bit lines BL. The memory cell array 110 may include memory cells arranged in a plurality of rows (or, word lines) and a plurality of columns (or, bit lines). The plurality of memory cells in the memory cell array 110 may constitute a plurality of memory blocks. One memory block is exemplarily illustrated in FIG. 2. Memory cells within each memory block may be arranged to have a NAND string structure as shown in FIG. 2 or a NOR structure (not shown).

Referring to FIG. 2, each memory block may include a plurality of cell strings (or, NAND strings) 111 connected with bit lines BL0 to BLm−1, respectively. Each cell string 111 may include at least one string selection transistor SST, a plurality of memory cells MC0 to MCn−1, and at least one ground selection transistor GST. In each cell string 111, a drain of the string selection transistor SST may be coupled with a corresponding bit line, and a source of the ground selection transistor GST may be coupled with a common source line CSL. In each cell string 111, the memory cells MC0 to MCn−1 may be connected in series between a source of the string selection transistor SST and a drain of the ground selection transistor GST.

Memory cells MC0 to MCn−1 may be configured to store N-bit information of data (N being an integer of 1 or more), respectively. The memory cells MC0 to MCn−1 may store bit information by injecting charges into their charge storage layers. In an exemplary embodiment, the memory cells MC0 to MCn−1 may use a conductive floating gate surrounded by an insulation film as a charge storage layer, respectively. In another exemplary embodiment, the memory cells MC0 to MCn−1 may use an insulation film such as $Si_3N_4$, $Al_2O_3$, HfAlO, HfSiO, etc. as a charge storage layer. A flash memory device using an insulation film such as $Si_3N_4$, $Al_2O_3$, HfAlO, HfSiO, etc. as a charge storage layer may be called a charge trap flash (CTF) memory. Characteristics of the flash memory device 100 being described below may be applied both to a flash memory device using a conductive floating gate as a charge storage layer and to a CTF memory using an insulation film as a charge storage layer.

Further, the memory cell array 110 can be configured to have one of a stack flash structure including a plurality of cell arrays stacked in a multi-layer manner, a source-drain free flash structure, a pin-type flash structure, a three-dimensional (or, vertical-type) flash structure, and the like.

In FIG. 2, there is exemplarily shown the case that the flash memory device 100 is formed of a NAND-type flash memory device. However, the inventive concept is not limited thereto. For example, characteristics of the flash memory device 100 may be applied to a NAND-type flash memory device, a NOR-type flash memory device, a hybrid flash memory device including at least two types of memory devices, a flash memory in which a controller is embedded, and the like.

As illustrated in FIG. 2, control gates of memory cells in the same row may be coupled with a corresponding word line in common. The string selection transistor SST may be controlled by a voltage applied via a string selection line SSL, and the ground selection transistor GST may be controlled by a voltage applied via a ground selection line GSL. Memory cells MC0 and MCn−1 may be controlled by voltages applied via corresponding word lines WL0 to WLn−1.

Memory cells connected with each of the word lines WL0 to WLn−1 may store data corresponding to a page, a sub-page less than a page, or a plurality of pages. Read and program operations of the NAND-type flash memory device may be carried out by a unit of one or more pages. The read and program operations can be performed by the sub-page as occasion demands. An erase operation of the NAND-type flash memory device may be made by the block formed of a plurality of pages.

Returning to FIG. 1, the control logic 190 may control an overall operation of the flash memory device 100 associated with program, read, and erase operations. The voltage generating unit 170 may be configured to generate word line voltages to be supplied to word lines and a voltage to be supplied to a bulk (e.g., a well region), according to a mode of operation. As well understood, memory cells may be formed at the bulk, that is, the well region. The voltage generating unit 170 may operate responsive to the control of the control logic 190.

The voltage generating unit 170 may include a high voltage generator 171, a low voltage generator 173, and a negative voltage generator 175. The high voltage generator 171 may be configured to generate positive high voltages, needed to drive the flash memory device 100, in response to the control of the control logic 190. The positive high voltages generated from the high voltage generator 171 may be used as a program voltage Vpgm, a pass voltage Vpass, etc. at a program operation.

The low voltage generator 173 may be configured to generate positive low voltages, needed to drive the flash memory device 100, in response to the control of the control logic 190. The positive low voltages generated from the low voltage generator 173 may be used as a read voltage Vrd, a verification voltage Vvfy, a decoupling voltage, a blocking voltage, etc. at a program or read operation. In this embodiment, a positive pumping operation of the low voltage generator 173 may be performed after an input of a command is completed, and levels of a read voltage Vrd, a verification voltage Vvfy, a decoupling voltage, a blocking voltage, etc. generated from the low voltage generator 173 may be adjusted by dividing a positive pumping result using a plurality of resistors. In this case, it is possible to control a positive word line voltage using a trim code in order to output a required level.

The negative voltage generator 175 may be configured to generate negative voltages, needed to drive the flash memory device 100, according to the control of the control logic 190. The negative voltages generated from the negative voltage generator 175 may be used as a read voltage Vrd, a verification voltage Vvfy, a decoupling voltage, a blocking voltage, etc. at a program or read operation.

The negative voltages generated from the negative voltage generator 175 can be supplied to a bulk (e.g., a well region) in which memory cells are formed. Below, voltages applied to word lines for driving of the flash memory device 100 may be called word line voltages.

Outputs of the high voltage generator 171 and the low voltage generator 173 may be transferred to the voltage selection switch 180, and an output of the negative voltage generator 175 may be transferred to the voltage selection switch 180 and the row decoder 120.

Herein, the high and low voltage generators 171 and 173 can be implemented by one voltage generator. In this case, since the high and low voltage generators 171 and 173 generate positive voltages, they may be represented by a positive voltage generator. That is, the voltage generating unit 170 may be formed of a positive voltage generator (171 and 173) and the negative voltage generator 175.

The row decoder 120 may be coupled with the voltage selection switch 180 and the memory cell array 110. The row decoder 120 may be configured to operate responsive to the control of the control logic 190. The row decoder 120 may decode a row address X-ADDR received from an external device. The row decoder 120 may select word lines WL according to a decoding result of the row address X-ADDR. The row decoder 120 may transfer an output of the voltage selection switch 180 to a selected word line and unselected word lines.

The voltage selection switch 180 may be coupled with the voltage generating unit 170, the row decoder 120, and the control logic 190. The voltage selection switch 180 may select one of output voltages of the voltage generating unit 170 in response to the control of the control logic 190. A voltage selected by the voltage selection switch 180 may be supplied to a corresponding word line WL via the row decoder 120.

In this embodiment, the voltage selection switch 180 may use transistors as a switching element or a transfer gate. For example, the voltage selection switch 180 may use a field effect transistor FET as a switching element or a transfer gate.

In the event that an output of the negative voltage generator 175 is selected according to the control of the control logic 190, the voltage selection switch 180 may transfer a negative voltage generated from the negative voltage generator 175 to the row decoder 120. Well regions of the voltage selection switch 180 and the row decoder 120 may be biased by a negative voltage from the negative voltage generator 175 to transfer a negative voltage to the row decoder 120 via a field effect transistor.

If deactivated, the negative voltage generator 175 may generate a ground voltage in response to the control of the control logic 190. When a high or low voltage is transferred to word lines via the voltage selection switch 180 and the row decoder 120, well regions of the voltage selection switch 180 and the row decoder 120 may be biased by the ground voltage generated by negative voltage generator 175.

The column decoder 130 may be coupled with the read/write circuit 140. The column decoder 130 may be configured to operate responsive to the control of the control logic 190. The column decoder 130 may decode a column address Y-ADDR received from the external device. A decoding result of the column address Y-ADDR may be provided to the read/write circuit 140.

The read/write circuit 140 may operate responsive to the control of the control logic 190, and may operate as a sense amplifier or a write driver according to a mode of operation. For example, during a verify-read/normal read operation, the read/write circuit 140 may operate as a sense amplifier for reading data from the memory cell array 110. During the normal read operation, data read via the read/write circuit 140 may be output to the external device (e.g., a memory controller or a host). During the verify-read operation, data read via the read/write circuit 140 may be provided to a pass/fail checking circuit (not shown) within the flash memory device 100 to judge whether memory cells are programmed normally.

During a program operation, the read/write circuit 140 may operate as a write driver for driving bit lines BL0 to BLm−1 according to data to be stored in the memory cell array 110. During a program operation, the read/write circuit 140 may receive data to be written in the memory cell array 110 from a buffer (not shown), and may drive the bit lines BL0 to BLm−1 according to the input data. The read/write circuit 140 may include a plurality of page buffers PB each corresponding to columns (or, bit lines) or column pairs (or, bit line pairs), as shown in FIG. 2. Each page buffer may include a plurality of latches, which are used to latch sensed data and/or to latch data to be programmed.

Figure 3:
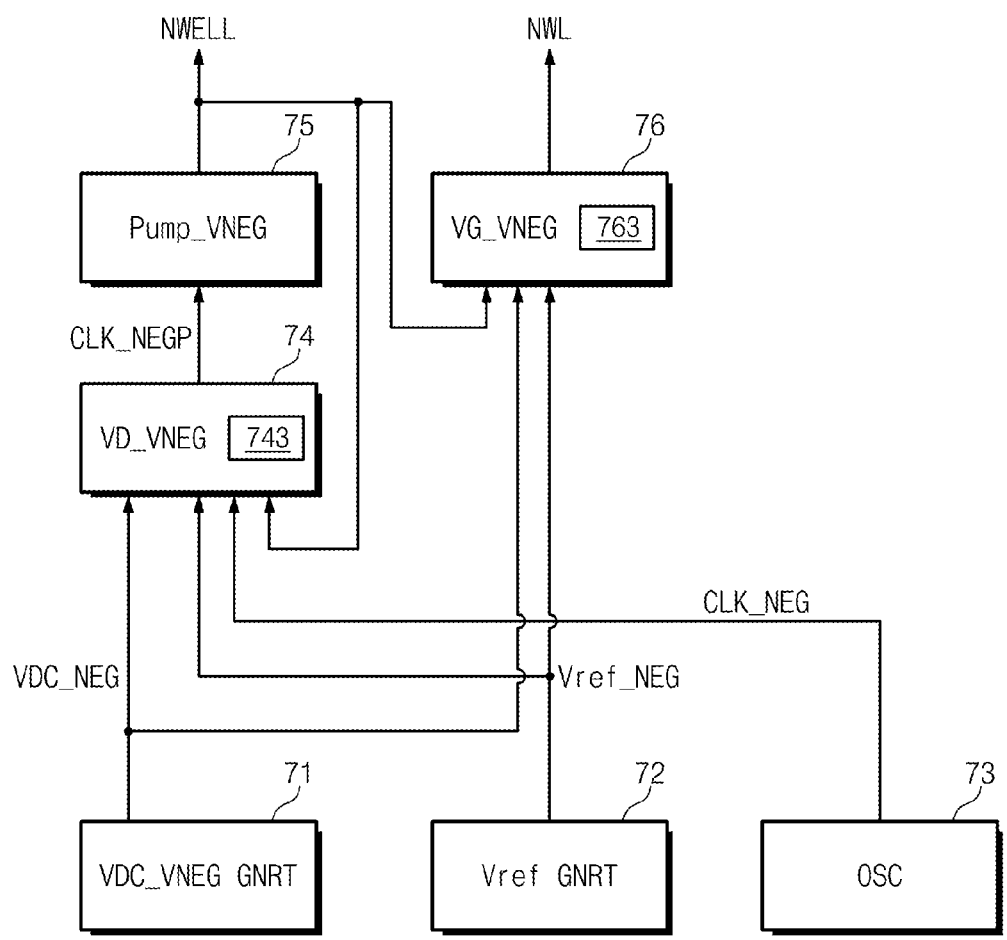
FIG. 3 is a block diagram illustrating a negative voltage generator shown in FIG. 1.

FIG. 3 is a block diagram illustrating a negative voltage generator shown in FIG. 1.

Referring to FIG. 3, the negative voltage generator 175 may include a DC voltage generator 71, a reference voltage generator 72, an oscillator 73, a negative voltage detector 74, a negative voltage pump 75, and a negative voltage generator 76 for a word line.

The DC voltage generator 71 may be configured to generate a DC voltage VDC_NEG, and the reference voltage generator 72 may be configured to generate a reference voltage Vref_NEG.

The oscillator 73 may generate a clock CLK_NEG for a negative voltage. In this embodiment, the clock CLK_NEG may have a period of 30 ns. Herein, the oscillator 73 may be implemented independently from an oscillator of a high voltage generator 171 illustrated in FIG. 1. In another embodiment, an oscillator of a high voltage generator 171 illustrated in FIG. 1 can be used as the oscillator 73 of the negative voltage generator 175.

The negative voltage detector 74 may receive the DC voltage VDC_NEG and the clock CLK_NEG, and may detect a negative voltage NWELL for a well voltage to generate a clock CLK_NEGP for a negative voltage pump.

The negative voltage detector 74 may include a discharge part 743, and may be configured to selectively discharge the negative voltage NWELL. For example, control logic 190 may deactivate the discharge part 743 when a discharge result of the discharge part 743 is higher in level than the reference voltage Vref_NEG and identical to or lower in level than a ground voltage. Alternatively, the control logic 190 may deactivate the discharge part 743 after a discharge operation of the discharge part 743 is carried out during a predetermined time. If the negative voltage NWELL becomes lower than the reference voltage Vref_NEG by the discharge operation of the discharge part 743, a negative voltage pumping operation of the negative voltage pump 75 may be activated.

It is possible to rapidly convert levels of the negative voltage NWELL, generated from the negative voltage pump 75, and a negative voltage NWL for a word line generated using the negative voltage NWELL. This means that a time taken for a program operation can be minimized.

In this embodiment, a result discharged by the discharge part 743 may have a level higher than the reference voltage Vref_NEG corresponding to a target negative voltage (TNV1, TNV2, etc.). In another embodiment, a result discharged by the discharge part 743 may have a level higher than the reference voltage Vref_NEG corresponding to a target negative voltage (TNV1, TNV2, etc.) and identical to or lower than a ground voltage. However, a level of a voltage discharged by the discharge part 743 is not limited thereto.

The negative voltage pump 75 may generate the negative voltage NWELL for a well voltage in response to the clock CLK_NEGP. The negative voltage NWELL may be applied to a circuit (not shown) to which a negative voltage is to be applied. The negative voltage NWELL is sensitive to external factors. For example, the well voltage NWELL may be affected by well capacitances. The negative voltage generator 76 for a word line may be provided between the negative voltage pump 75 and a word line to supply a negative voltage to a word line stably.

The negative voltage generator 76 may receive the well voltage NWELL, the DC voltage VDC_NEG, and the reference voltage Vref_NEG, and may generate a negative voltage NWL to be applied to a word line. The negative voltage NWL may be applied to at least one word line and at least one line (e.g., a selection line) corresponding to the at least one word line.

The negative voltage generator 76 may include a discharge part 763, and may be configured to selectively discharge the negative voltage NWL. According to a discharge operation of the discharge part 763, it is possible to prevent an influence of a word line capacitance due to the negative voltage NWL applied to a word line from the negative voltage generator 76. A discharge operation of the discharge part 763 may also be performed within a short time, and a level of a voltage discharged by the discharge part 763 is not limited to this disclosure.

According to the above-described negative voltage generator 175, a relationship between the negative voltages NWELL and NWL may be determined variously. For example, the negative voltages NWELL and NWL may be determined to have the same level. Alternatively, the negative voltages NWELL and NWL may be determined to have an offset of a specific level. That is, the negative voltages NWELL and NWL may be determined to maintain an offset of 0.5V. Still alternatively, the negative voltage NWELL may have a fixed level at a negative voltage range, while the negative voltage NWL may be changed to have various levels.

Figure 4:
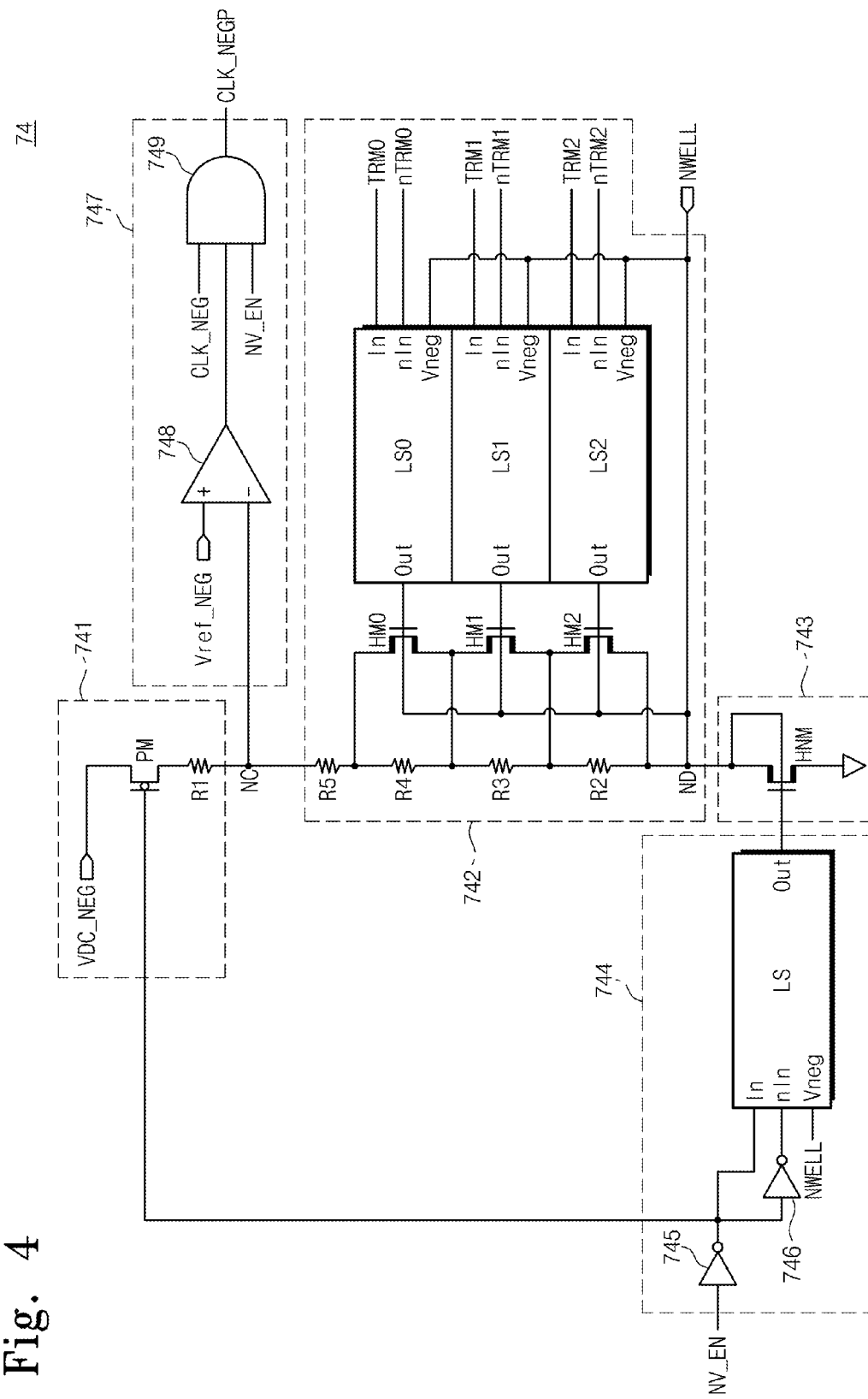
FIG. 4 is a circuit diagram illustrating a negative voltage detector 74 shown in FIG. 3.

FIG. 4 is a circuit diagram illustrating a negative voltage detector 74 in FIG. 3.

Referring to FIG. 4, a negative voltage detector 74 may include a power supply part 741, a division part 742, a discharge part 743, a comparison part 747, and a control part 744.

The power supply part 741 may determine a supply of a DC voltage VDC_NEG in response to a negative voltage enable signal NV_EN. The power supply part 741 may include a PMOS transistor PM and a resistor R1. A gate of the PMOS transistor PM may be connected to receive an inverted version of the negative voltage enable signal NV_EN. The resistor R1 may be connected between one end of the PMOS transistor PM and a comparison node NC. A current corresponding to a difference between the DC voltage VDC_NEG and a voltage of the comparison node NC may flow via the resistor R1 when the power supply part 741 is activated.

The voltage division part 742 may be configured to divide the DC voltage VDC_NEG. The voltage division part 742 may include resistors R2 to R5, high voltage transistors HM0 to HM2, and level shifters LS0 to LS2.

The resistors R2 to R5 may be connected in series between nodes NC and ND. Three resistors R2, R3, and R4 of the resistors R2 to R5 may be configured to be shorted according to corresponding trim codes TRM0 to TRM2 and nTRM0 to nTRM2. However, the number of resistors configured to be shorted is not limited thereto. For example, at least one resistor may be configured to be shorted according to at least one trim code.

A first high voltage transistor HM0 may be connected in parallel with the resistor R4, a second high voltage transistor HM1 may be connected in parallel with the resistor R3, and a third high voltage transistor HM2 may be connected in parallel with the resistor R2. Bodies (or, wells) of the first to third high voltage transistors HM0 to HM2 may be supplied with a negative voltage NWELL for a well voltage.

A first level shifter LS0 may include a positive input terminal In receiving a trim code TRM0, a negative input terminal nIn receiving an inverted trim code nTRM0, a well voltage input terminal Vneg receiving the well voltage NWELL, and an output terminal Out outputting a level corresponding to the trim code TRM0. The output terminal Out of the first level shifter LS0 may be connected with a gate of the first high voltage transistor HM0. Second and third level shifters LS1 and LS2 may be configured the same as the first level shifter LS0.

The discharge part 743 may be configured to discharge the negative voltage NWELL of a detection node ND in response to an inverted version of the negative voltage enable signal NV_EN. The discharge part 743 may be connected between the detection node ND and a ground terminal. In this embodiment, the discharge part 743 may include an NMOS transistor HNM. Herein, the NMOS transistor HNM may be a high voltage transistor. A body of the NMOS transistor HNM may be coupled with the detection node ND. If a level of the negative voltage NWELL becomes lower than a reference voltage Vref_NEG by a discharge operation of a discharge part 763, a negative voltage pumping operation of the negative voltage pump 75 may be activated. Accordingly, it is possible to rapidly convert levels of negative voltages generated one after another. A level of a voltage discharged by the discharge part 763 is not limited thereto.

The comparison part 747 may compare the reference voltage Vref_NEG for a negative voltage and a voltage of the comparison node NC to generate a clock CLK_NEGP for a negative voltage as a comparison result. The comparison part 747 may include a comparator 748 and a logical operator 749. The comparator 748 may include a positive input terminal receiving the reference voltage Vref_NEG and a negative input terminal receiving a voltage of the comparison node NC. In this embodiment, the comparator 748 may be implemented by a differential amplifier. The logical operator 749, which may perform a logical OR operation, may generate the clock CLK_NEGP in response to the clock CLK_NEG, an output of the comparator 748, and the negative voltage enable signal NV_EN.

The control part 744 may determine activation of the power supply part 741 and the discharge part 743 in response to the negative voltage enable signal NV_EN. The control part 744 may include a first inverter 745, a second inverter 746, and a level shifter LS. The first inverter 745 may invert the negative voltage enable signal NV_EN. An output of the first inverter 745 may be applied to a gate of the PMOS transistor PM of the power supply part 741. The second inverter 746 may invert an output of the first inverter 745. The level shifter LS may convert a level of an output of the second inverter 746 into a level for a high voltage. The level-converted output of the second inverter 746 may be applied to a gate of the NMOS transistor HNM of the discharge part 743.

The level shifter LS may include a positive input terminal In receiving an output of the first inverter 745, a negative input terminal nIn receiving an output of the second inverter 746, a well voltage input terminal Vneg receiving the negative voltage NWELL for a well voltage, and an output terminal Out. The level shifter LS may be implemented the same as the first level shifter LS0 of the voltage division part 742.

As will be described below, a voltage detector 74 of a negative voltage generator 175 can be removed when an interval, in which negative voltages NWL and NWELL are generated from the negative voltage generator 175, is controlled by a predetermined reference time RefPT set within a negative voltage pumping interval. In this case, it is possible to simplify a negative charge pumping circuit and a control method thereof. Accordingly, negative charge pumping may be made efficiently within an optimized time.

Figure 5:
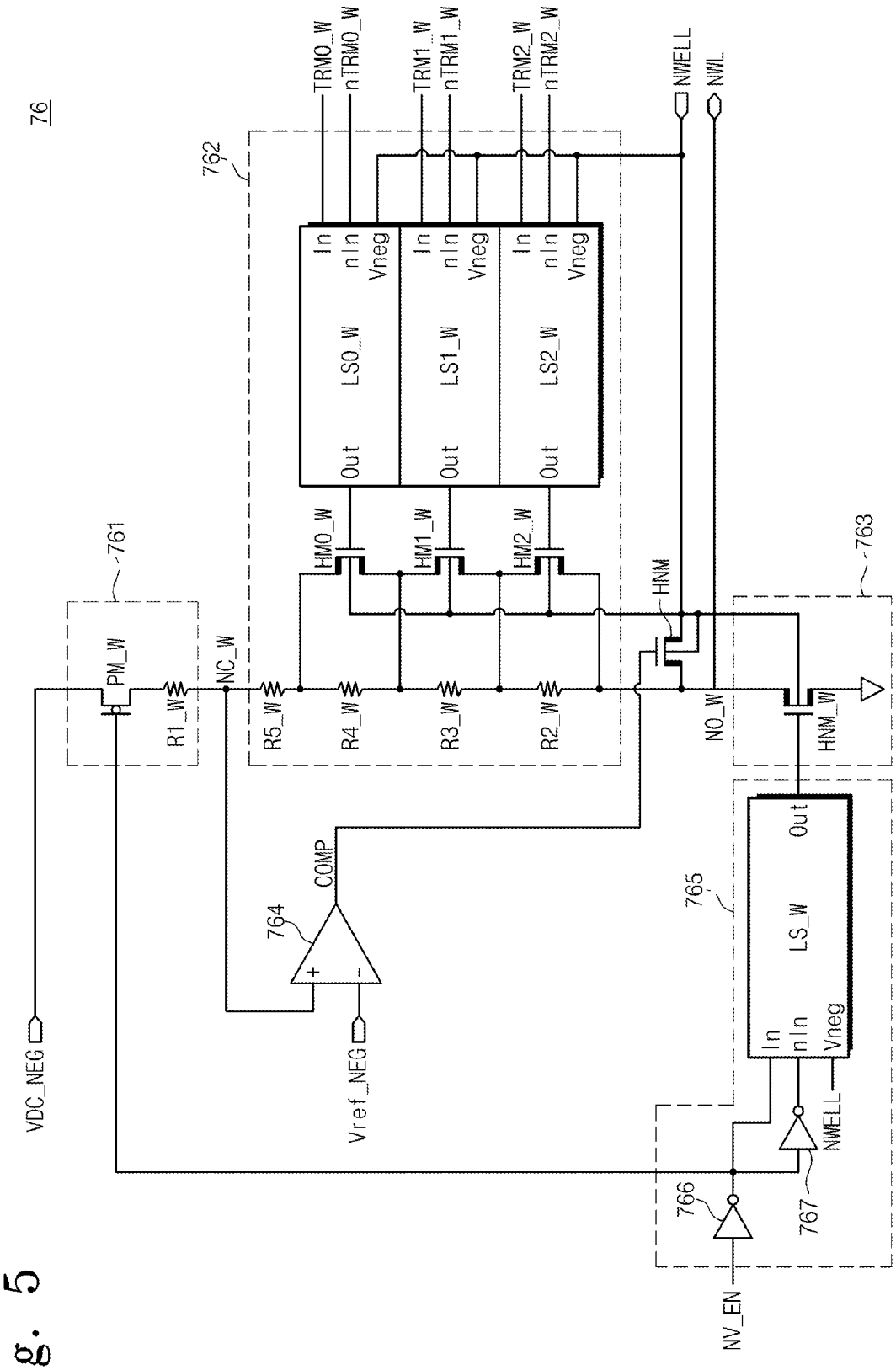
FIG. 5 is a block diagram illustrating a negative voltage generator for a word line shown in FIG. 3.

FIG. 5 is a block diagram illustrating a negative voltage generator for a word line in FIG. 3.

Referring to FIG. 5, a negative voltage generator 76 may include a power supply part 761, a division part 762, a discharge part 763, a comparison part 764, and a control part 765.

The power supply part 761 may determine a supply of a DC voltage VDC_NEG in response to a negative voltage enable signal NV_EN. The power supply part 761 may include a PMOS transistor PM_W and a resistor R1_W. A gate of the PMOS transistor PM_W may be connected to receive an inverted version of the negative voltage enable signal NV_EN. The resistor R1_W may be connected between one end of the PMOS transistor PM_W and a comparison node NC_W. A current corresponding to a difference between the DC voltage VDC_NEG and a voltage of the comparison node NC_W may flow via the resistor R1_W when the power supply part 761 is activated.

The voltage division part 762 may be configured to divide the DC voltage VDC_NEG. The voltage division part 762 may include resistors R2_W to R5_W, first to third high voltage transistors HM0_W to HM2_W, and first to third level shifters LS0_W to LS2_W.

The resistors R2_W to R5_W may be connected in series between nodes NC_W and NO_W. Three resistors (e.g., R2_W, R3_W, and R4_W) of the resistors R2_W to R5_W may be configured to be shorted according to corresponding trim codes TRM0_W to TRM2_W. However, the number of resistors configured to be shorted is not limited thereto. For example, at least one resistor may be configured to be shorted according to at least one trim code.

The first high voltage transistor HM0_W may be connected in parallel with the resistor R4_W, the second high voltage transistor HM1_W may be connected in parallel with the resistor R3_W, and the third high voltage transistor HM2_W may be connected in parallel with the resistor R2_W. Bodies (or, wells) of the first to third high voltage transistors HM0_W to HM2_W may be supplied with a negative voltage NWELL for a well voltage from a negative voltage pump 75.

The first level shifter LS0_W may include a positive input terminal In receiving a trim code TRM0_W, a negative input terminal nIn receiving an inverted trim code nTRM0_W, a well voltage input terminal Vneg receiving the well voltage NWELL, and an output terminal Out outputting a level corresponding to the trim code TRM0_W. The output terminal Out of the first level shifter LS0_W may be connected with a gate of the first high voltage transistor HM0_W. The second and third level shifters LS1_W and LS2_W may be configured the same as the first level shifter LS0_W.

The discharge part 763 may be configured to discharge the negative voltage NWL (to be supplied to a word line) of the output node NO_W in response to an inverted version of the negative voltage enable signal NV_EN. The discharge part 763 may be connected between the output node NOW and a ground terminal. In this embodiment, the discharge part 763 may include an NMOS transistor HNM_W. Herein, the NMOS transistor HNM_W may be a high voltage transistor. A body of the NMOS transistor HNM_W may be connected to receive the well voltage NWELL.

The comparison part 764 may compare the reference voltage Vref_NEG for a negative voltage and a voltage of the comparison node NC_W. The comparison part 764 may provide a comparison result to a gate of an NMOS transistor HNM. The well voltage NWELL and a word line voltage NWL may be switched by the NMOS transistor HNM.

The comparison part 764 may include a negative input terminal receiving the reference voltage Vref_NEG and a positive input terminal receiving a voltage of the comparison node NC_W. In this embodiment, the comparison part 764 may be implemented by a differential amplifier.

The control part 765 may determine activation of the discharge part 763 in response to the negative voltage enable signal NV_EN. The control part 765 may include a first inverter 766, a second inverter 767, and a level shifter LS_W. The first inverter 766 may invert the negative voltage enable signal NV_EN. The second inverter 767 may invert an output of the first inverter 766. The level shifter LS_W may convert a level of an output of the second inverter 767 into a level for a high voltage. The level-converted output of the second inverter 767 may be applied to a gate of the NMOS transistor HNM_W of the discharge part 763.

The level shifter LS_W may include a positive input terminal In receiving an output of the first inverter 766, a negative input terminal nIn receiving an output of the second inverter 767, a well voltage input terminal Vneg receiving the negative voltage NWELL for a well voltage, and an output terminal Out. The level shifter LS_W may be implemented the same as the first level shifter LS0_W of the voltage division part 762.

A negative voltage generator 175 according to an exemplary embodiment of the inventive concept may include a negative voltage generator 76 for a word line which is configured to generate a negative voltage NWL applied to a word line as shown in FIG. 3. However, the negative voltage generator 76 need not be included within the negative voltage generator 175 according to an exemplary embodiment of the inventive concept.

Figure 6:
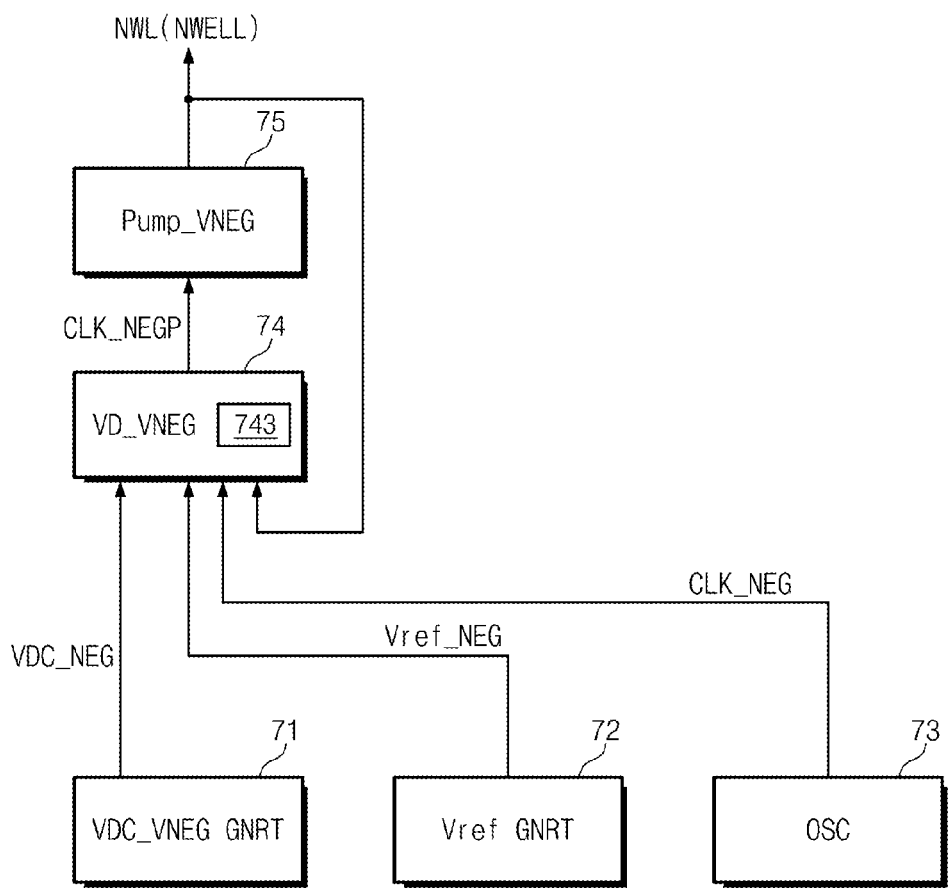
FIG. 6 is a block diagram illustrating a negative voltage generator shown in FIG. 3 according to another exemplary embodiment of the inventive concept.

FIG. 6 is a block diagram illustrating a negative voltage generator 175_1 as an alternative to the negative voltage generator 175 shown in FIG. 3, according to another exemplary embodiment of the inventive concept.

Referring to FIG. 6, a negative voltage generator 175_1 may include a DC voltage generator 71, a reference voltage generator 72, an oscillator 73, a negative voltage detector 74, and a negative voltage pump 75. The negative voltage generator 175_1 in FIG. 6 may be substantially identical to that in FIG. 3 except that a negative voltage generator 76 for a word line is removed, and description thereof is thus omitted. In this case, an output voltage of the negative voltage pump 75 may be supplied to a well and a word line in common.

Figure 7:
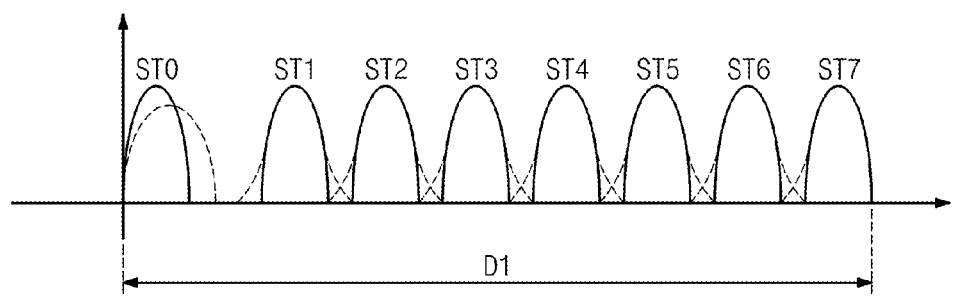
FIGS. 7 and 8 are diagrams illustrating threshold voltage distributions of a multi-bit flash memory device which stores 3-bit data per cell.
Figure 8:
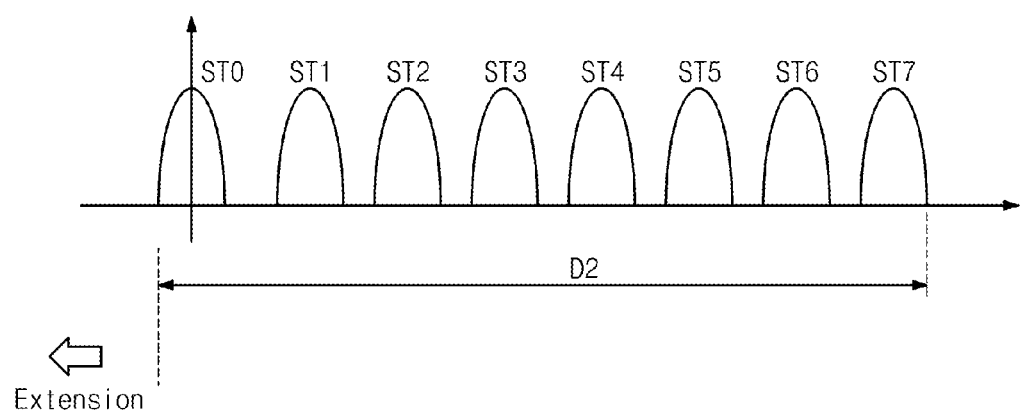

FIGS. 7 and 8 are diagrams illustrating threshold voltage distributions of a multi-bit flash memory device which stores 3-bit data per cell.

Referring to FIG. 7, in the event that one memory cell stores K-bit data, it may be programmed to have one of $2^K$ threshold voltage distributions (e.g., 8 in case of K=3). Due to a difference of fine electric characteristics of memory cells, threshold voltages of memory cells may form threshold voltage distributions with a predetermined range corresponding to program states ST0 to ST7, respectively.

In case of an ideal case, as represented by a solid line in FIG. 7, a threshold voltage distribution may be spaced apart from an adjacent threshold voltage distribution. This means that the read margin exists between adjacent threshold voltage distributions. A threshold voltage of each memory cell may be distributed at a voltage region higher in level than a program-verification voltage of a corresponding program state.

The number of program states (i.e., the number of threshold voltage distributions each corresponding to the program states) may increase in proportion to an increase of the number of bits capable of being stored in a memory cell. A threshold voltage window may be secured to provide the sufficient read margin and the number of threshold voltage distributions corresponding to a cell-per-bit number. As well known, the threshold voltage window D1 in FIG. 7 for disposing threshold voltage distributions may be limited. For this reason, if a cell-per-bit number (or, K) increases, a distance (or, margin) between adjacent threshold voltage distributions may decrease.

As represented by a dotted line in FIG. 7, a threshold voltage distribution of a data state (or, a program state) may be varied in a non-ideal shape upon realizing of a multi-bit flash memory device. This phenomenon may become more serious according to an increase in a cell-per-bit number. Further, the phenomenon may become more serious due to various causes such as charge loss, time lapse, increase in a temperature, coupling between adjacent memory cells at programming, reading on adjacent memory cells, defects of memory cells, and the like. A variation of a threshold voltage distribution may cause the read error. This problem may be prevented by disposing threshold voltages of some memory cells at a negative voltage region as shown in FIG. 8.

A threshold voltage window may be widened from D1 to D2 (D2>D1) by disposing threshold voltages of some memory cells at a negative voltage region as shown in FIG. 8. It is advantageous to secure wider margins among program states by the widened threshold voltage window D2. The wider a negative voltage region of the threshold voltage window D2, the wider the threshold voltage window D2. Further, as a negative voltage region of the threshold voltage window D2 is extended, it is possible to generate various negative voltage levels using a negative voltage generator 175. In this case, it is necessary to generate various negative voltage levels at high speed.

Figure 9:
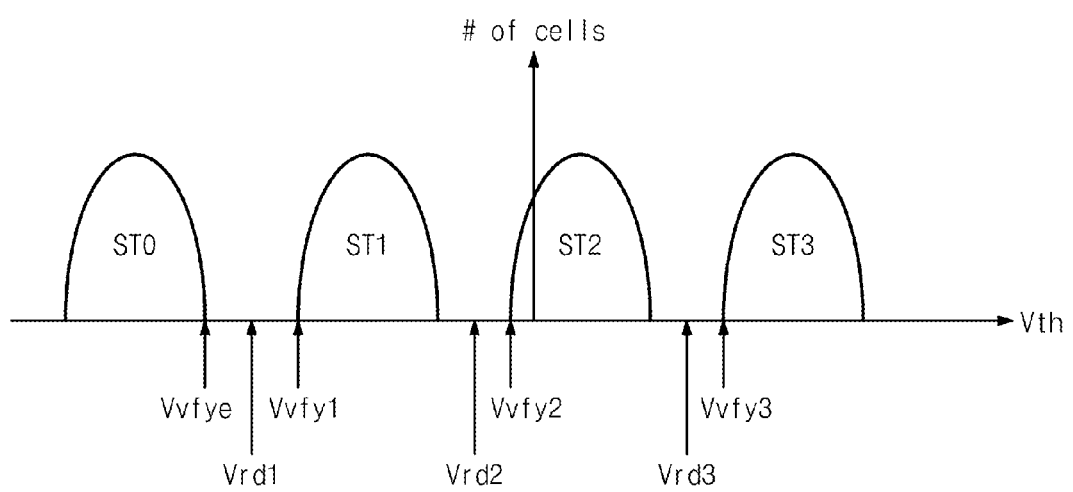
FIG. 9 is a diagram illustrating threshold voltage distributions, verification voltages, and read voltages when threshold voltages of some memory cells are distributed at a negative voltage region.
Figure 10:
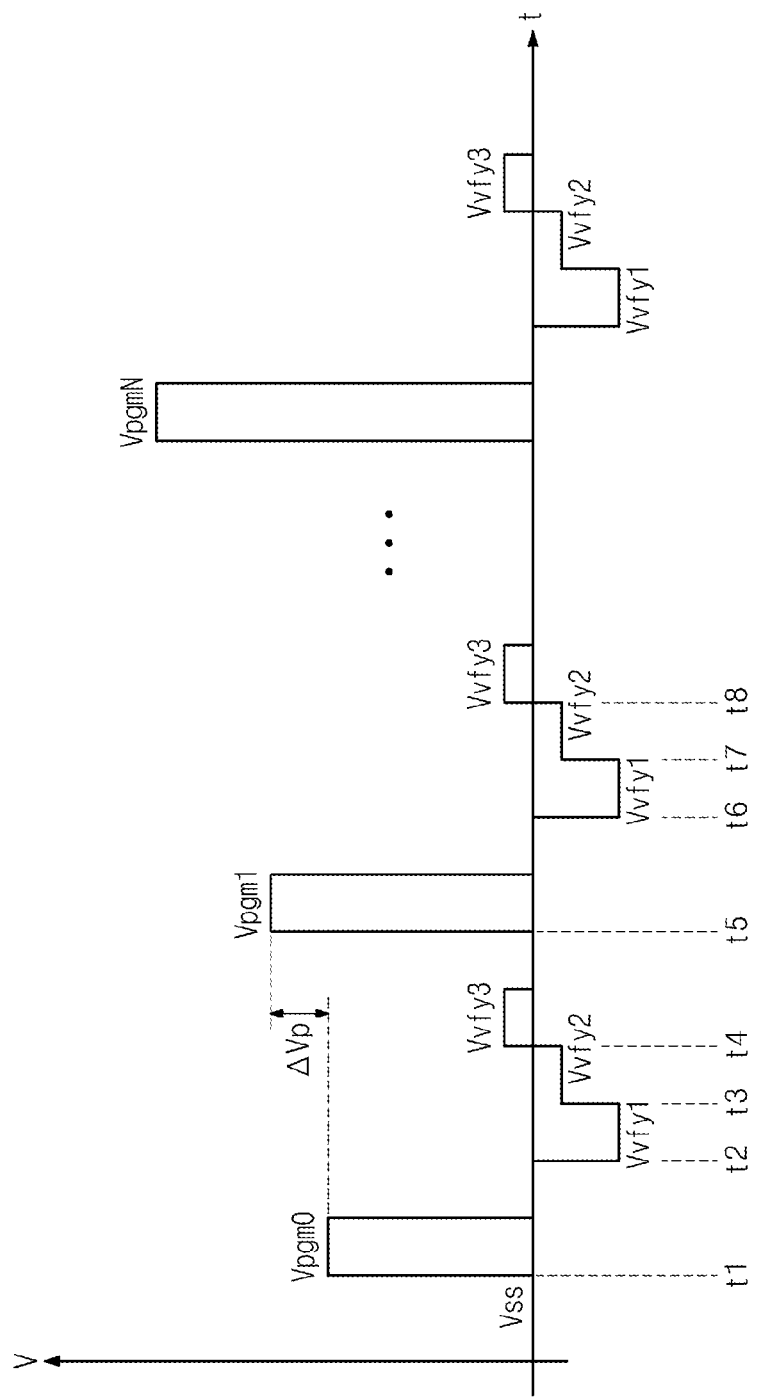
FIG. 10 is a diagram for describing a program operation using verification voltages in FIG. 9.

FIG. 9 is a diagram illustrating threshold voltage distributions, verification voltages, and read voltages when threshold voltages of some memory cells are distributed at a negative voltage region. FIG. 10 is a diagram for describing a program operation using verification voltages in FIG. 9.

In FIG. 9, a horizontal axis may represent threshold voltages of memory cells, and a vertical axis may represent the number of memory cells. In FIG. 9, there is exemplarily shown the case that memory cells have an erase state ST0, a first program state ST1, a second program state ST2, and a third program state ST3. However, the inventive concept is not limited thereto. Logical states ST0 to ST3 of memory cells and the number of logical states may be changed variously.

Since a flash memory device 100 is not rewritten, memory cells may be erased prior to a program operation. That is, memory cells may be set to have the erase state ST0 prior to programming. Memory cells may be distributed to have threshold voltage distributions in FIG. 9. This may be accomplished by erasing the memory cells so as to have threshold voltages (or, to be distributed within a threshold voltage distribution ST0) lower in level than an erase-verification voltage Vvfye. After erased to have the erase state ST0, memory cells may be programmed to have one of the first to third program states ST1 to ST3. Herein, threshold voltages of memory cells having the first program state ST1 may be higher in level than a first verification voltage Vvfy1. Threshold voltages of memory cells having the second program state ST2 may be higher in level than a second verification voltage Vvfy2. Threshold voltages of memory cells having the third program state ST3 may be higher in level than a third verification voltage Vvfy3. If a program operation on memory cells is completed, data of data/logical/program states ST0 to ST3 may be read via a normal read operation. As shown in FIG. 9, it is possible to discriminate the data states ST0 to ST3 using first to third read voltages Vrd1 to Vrd3 at a normal read operation.

In this embodiment, the first and second read voltages Vrd1 and Vrd2 may be a negative voltage. The second read voltage Vrd2 may be higher in level than the first read voltage Vrd1. The third read voltage Vrd3 may be a positive voltage. The third read voltage Vrd3 may be higher in level than the second read voltage Vrd2. For example, the third read voltage Vrd3 may be a positive low voltage. The third read voltage Vrd3 may be generated from a low voltage generator 173 according to the control of control logic 190 in FIG. 1. The first and second read voltages Vrd1 and Vrd2 may be generated from a negative voltage generator 175 according to the control of the control logic 190.

In case of FIG. 9, the negative voltage generator 175 may be configured to generate the second read voltage Vrd2 without delay after generation of the first read voltage Vrd1 under the control of the control logic 190. Alternatively, the negative voltage generator 175 may be configured to generate the first read voltage Vrd1 after generation of the second read voltage Vrd2 under the control of the control logic 190. An order of generating read voltages to be applied at successive read operations may be determined variously under the control of the control logic 190.

For example, in the event that the second read voltage Vrd2 is generated without delay after generation of the first read voltage Vrd1, an output of the negative voltage generator 175, that is, the first read voltage Vrd1 may be discharged to a level, and then the second read voltage Vrd2 may be generated by a negative charge pumping operation. This manner may be used to shorten a time taken to vary a negative voltage level. In this embodiment, a discharge operation of the negative voltage generator 175 for resuming a negative charge pumping operation may be made via a discharge part 743 within a negative voltage detector 74. Further, the negative voltage generator 175 may remove an influence of a word line capacitance due to applying of a negative voltage (e.g., the first read voltage Vrd1) through a discharge operation of the discharge part 763 within a negative voltage generator 76.

According to an exemplary embodiment of the inventive concept, switching of a negative voltage from a low negative voltage level to a high negative voltage level may be made rapidly. Further, it is possible to effectively remove an influence of a word line capacitance due to a previously applied negative voltage.

In the event that the first read voltage Vrd1 is generated without delay after generation of the second read voltage Vrd2, the first read voltage Vrd1 may be generated via a negative charge pumping operation without a discharge operation of an output of the negative voltage generator 175, that is, the second read voltage Vrd2. According to the above description, a discharge operation may be selectively performed according to levels of negative read voltages generated in sequence. This means that different levels of negative voltages are generated rapidly.

Referring to FIGS. 9 and 10, the flash memory device 100 may perform a program operation according to an incremental step pulse programming (ISPP) manner to exactly control a threshold voltage distribution. As illustrated in FIG. 10, according to the ISPP manner, a program voltage Vpgm may increase stepwise by an increment ΔVp at iteration of program loops. A verify-read operation may be performed three times using first to third verification voltages Vvfy1, Vvfy2, and Vvfy3 whenever a program voltage Vpgm_i (i=0~N) is applied at each program loop.

The program voltages Vpgm0 to VpgmN may be a positive high voltage. In this embodiment, the program voltages Vpgm0 to VpgmN may be generated from a high voltage generator 171 under the control of the control logic 190.

In this embodiment, the first and second verification voltages Vvfy1 and Vvfy2 may be a negative voltage. The second verification voltage Vvfy2 may be higher in level than the first verification voltage Vvfy1. The first and second verification voltages Vvfy1 and Vvfy2 may be generated from the negative voltage generator 175 under the control of the control logic 190. The third verification voltage Vvfy3 may be a positive low voltage. The third verification voltage Vvfy3 may be higher in level than the second verification voltage Vvfy2. The third verification voltage Vvfy3 may be generated from the low voltage generator 173 under the control of the control logic 190.

In case of a program manner in FIG. 10, the negative voltage generator 175 may be configured to generate the second verification voltage Vvfy2 without delay after generation of the first verification voltage Vvfy1 under the control of the control logic 190. In order to reduce a time taken to generate the second verification voltage Vvfy2 after generation of the first verification voltage Vvfy1, an output of the negative voltage generator 175 may be discharged to a level rapidly, and then the second verification voltage Vvfy2 may be generated by a negative charge pumping operation. In this case, a negative voltage may be generated relatively rapidly as compared with such a manner that no discharge operation is performed when the second verification voltage Vvfy2 is generated from the first verification voltage Vvfy1. A method of generating different levels of negative voltages will be more fully described below.

Figure 11:
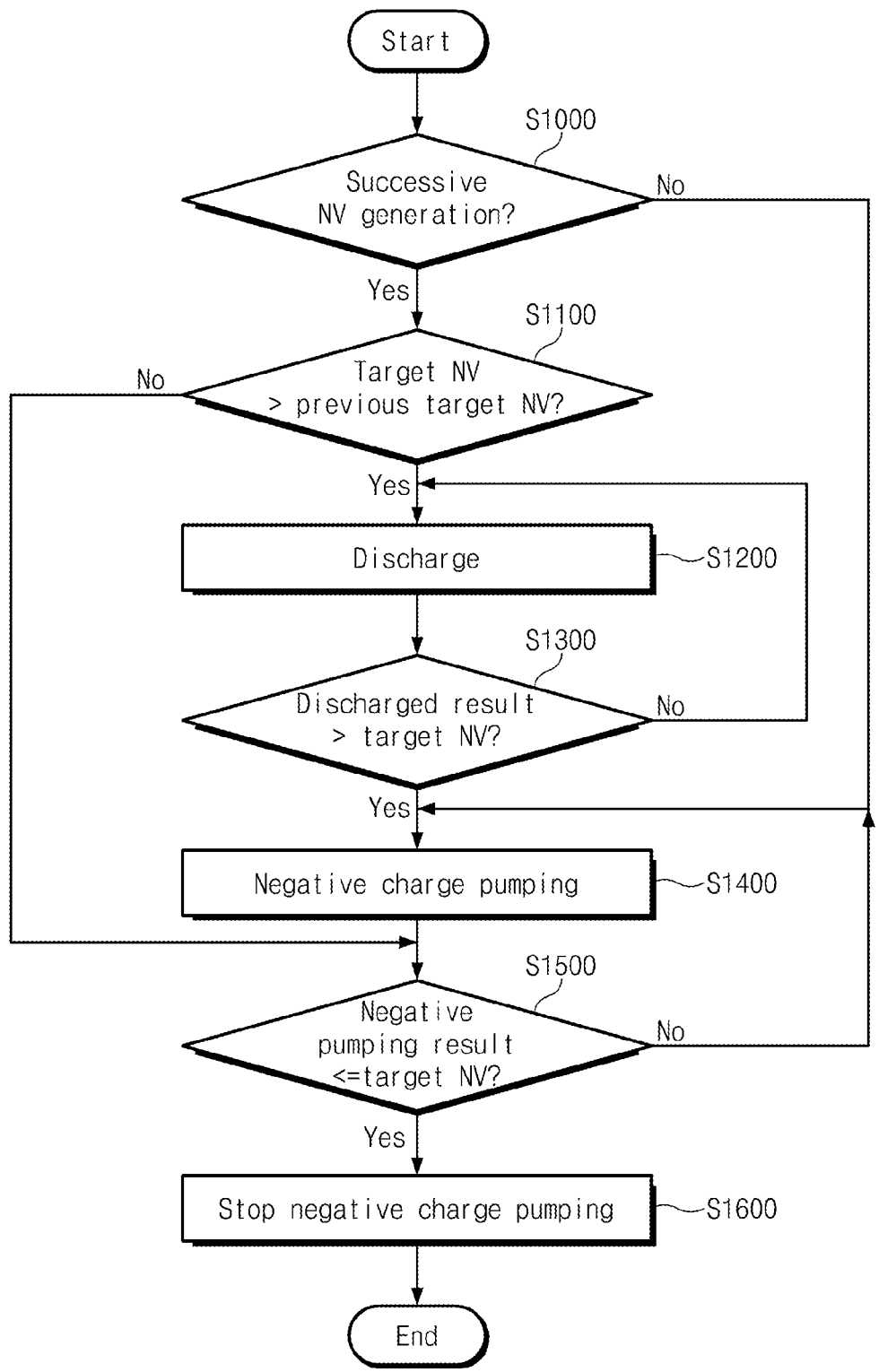
FIG. 11 is a flowchart for describing a negative voltage generating method according to an exemplary embodiment of the inventive concept.
Figure 12:
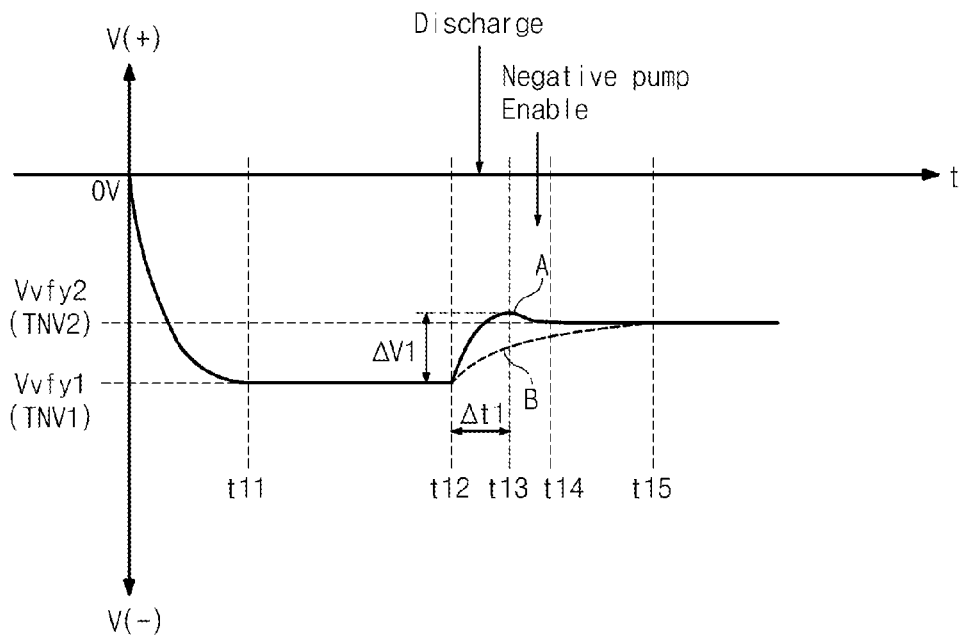
FIGS. 12 and 13 are diagrams illustrating waveforms of negative voltages generated according to a negative voltage generating method.
Figure 13:
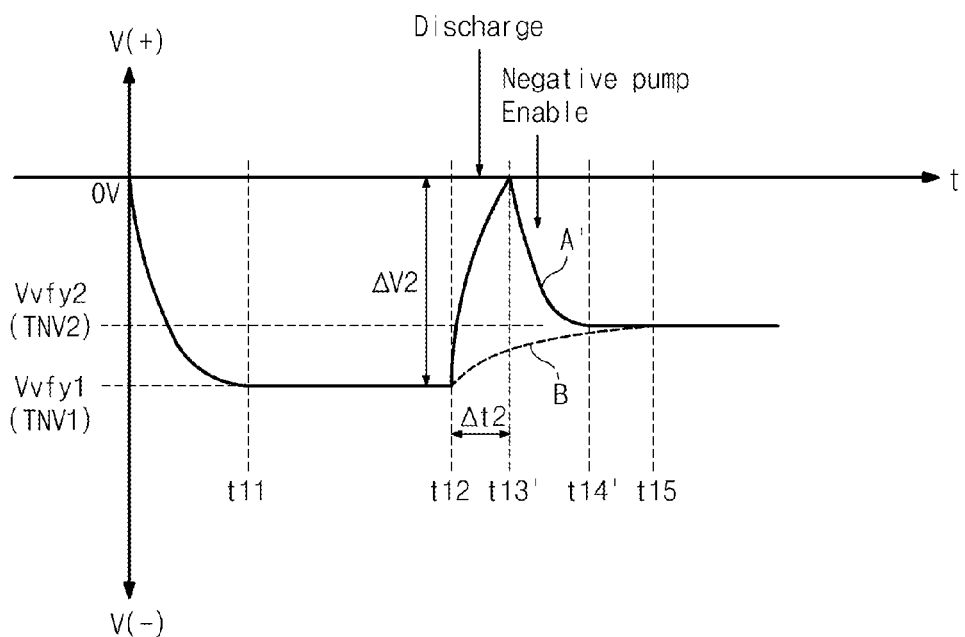

FIG. 11 is a flowchart for describing a negative voltage generating method according to an exemplary embodiment of the inventive concept. FIGS. 12 and 13 are diagrams illustrating waveforms of negative voltages generated according to a negative voltage generating method. FIGS. 12 and 13 exemplarily show waveforms of first and second verification voltages Vvfy1 and Vvfy2 described in FIGS. 9 and 10. However, negative voltage types and levels are not limited thereto.

Referring to FIG. 11, in step S1000, there may be judged whether a negative voltage (e.g., a negative voltage NWL for a word line) is generated successively. Whether a negative voltage (e.g., a negative voltage NWL for a word line) is generated successively may be determined by control logic 190 which controls program, erase, and read operations of a flash memory device 100.

If a negative voltage is judged not to be generated successively, the method proceeds to step S1400, in which a negative charge pumping operation may be made. The case that a negative voltage is not generated successively may include cases that a first level of a negative voltage is generated, that different levels of negative voltages are generated discontinuously, and the like. In step S1500, there may be judged whether a negative charge pumping result is identical to or lower than a target negative voltage. Herein, the target negative voltage may be defined by setting of a value of a reference voltage Vref_NEG being a reference of a comparison.

If a negative charge pumping result is not identical to or lower than a target negative voltage, the negative charge pumping operation may be repeated until a negative charge pumping result becomes identical to or lower than a target negative voltage. If a negative charge pumping result is identical to or lower than a target negative voltage, the method proceeds to step S1600, in which the negative charge pumping operation is stopped.

Returning to step S1000, if a negative voltage is judged to be generated successively, the method proceeds to step S1100. In step S1100, there may be judged whether the target negative voltage is higher in level than a previous target negative voltage corresponding to a just previously generated negative voltage. The case that a negative voltage is generated successively may correspond to the case that a second verification voltage Vvfy2 is generated without delay after generation of a first verification voltage Vvfy1 as shown in FIG. 10, for example.

If the target negative voltage is higher in level than a previous target negative voltage, in step S1200, outputs of the negative voltage generator 175 may be discharged via discharge parts 743 and 763 within a short time. This may be performed in response to a negative voltage enable signal NV_EN applied to control parts 744 and 765 from the control logic 190. For example, the control parts 744 and 765 of the negative voltage detector 74 and the negative voltage generator 76 may determine activation of the discharge parts 743 and 763 in response to the negative voltage enable signal NV_EN.

Referring to FIGS. 12 and 13, the second verification voltage Vvfy2 may be a negative voltage higher in level than the first verification voltage Vvfy1. In FIGS. 12 and 13, a previous target negative voltage TNV1 may correspond to the first verification voltage Vvfy1, and a new target negative voltage TNV2 may correspond to the second verification voltage Vvfy2. The target negative voltages TNV1 and TNV2 may be provided to the negative voltage generator 175 according to an order of negative voltages to be generated and their levels needed for read, program, and erase operations of the flash memory device. Alternatively, the target negative voltages TNV1 and TNV2 may be set to the negative voltage generator 175 by the control logic 190 according to an order of negative voltages to be generated and their levels needed for read, program, and erase operations of the flash memory device.

In the event that the second verification voltage Vvfy2 is generated successively after generation of the first verification voltage Vvfy1, the control logic 190 may switch a target negative voltage, set or provided to the negative voltage generator 175, from TNV1 to TNV2. As the target negative voltage is switched from TNV1 to TNV2, a reference voltage Vref_NEG set to the negative voltage generator 175 may be changed to TNV2 from TNV1. In this case, during a period from t12 to t13, an output of the negative voltage generator 175 may be discharged to a level via the negative voltage generator 175 under the control of the control logic 190.

In FIG. 12, there is exemplarily illustrated the case that an output of the negative voltage generator 175 is discharged to a level lower than a ground voltage and higher than the target negative voltage TNV2. In FIG. 13, there is exemplarily illustrated the case that an output of the negative voltage generator 175 is discharged to a level identical to or lower than a ground voltage and higher than the target negative voltage TNV2. As illustrated in FIGS. 12 and 13, an output of the negative voltage generator 175 may be discharged to a level between the target negative voltage TNV2 and a ground voltage or to a ground level. A discharge level of an output of the negative voltage generator 175 may be controlled by adjusting discharge times Δt1 and Δt2, or by adjusting discharge magnitudes ΔV1 and ΔV2.

The magnitudes ΔV1 and ΔV2 may be changed variously within a voltage range from a level higher than the target negative voltage TNV2 to a level identical to or lower than a ground voltage.

Returning to FIG. 11, in step S1300, there may be judged whether a discharged output of the negative voltage generator 175 is higher than the target negative voltage TNV2. If the discharged output of the negative voltage generator 175 is lower than the target negative voltage TNV2, a discharge operation may be performed until the discharged output of the negative voltage generator 175 is higher than the target negative voltage TNV2. If the discharged output of the negative voltage generator 175 is higher than the target negative voltage TNV2, the discharge operation may be stopped, and then the negative charge pumping operation may be performed in step S1400.

Figure 14:
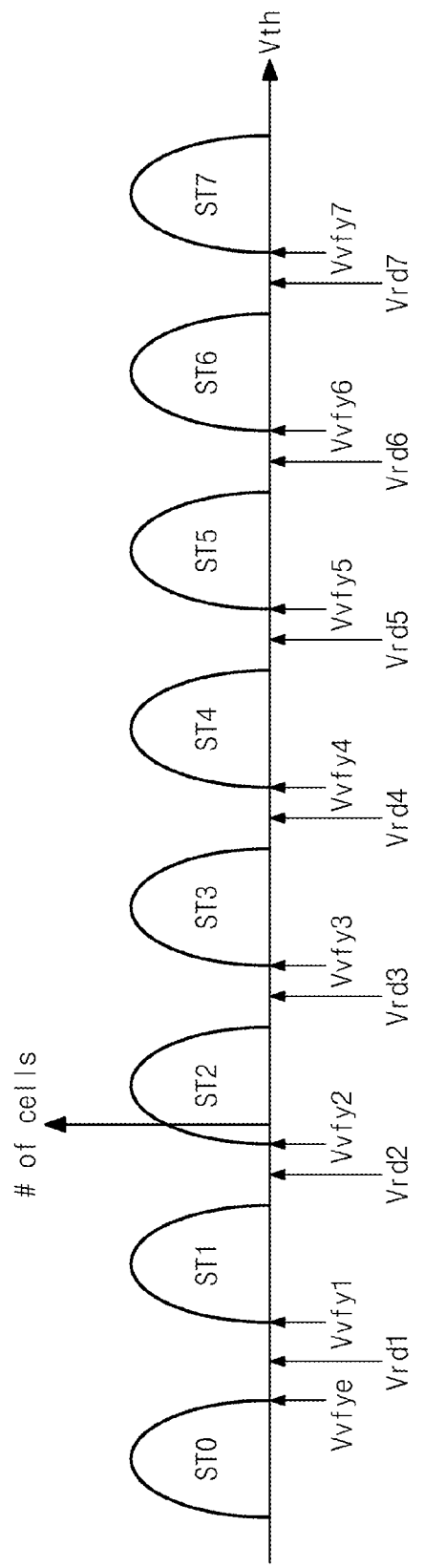
FIG. 14 is a diagram illustrating threshold voltage distributions, verification voltages, and read voltages when threshold voltages of some memory cells are distributed at a negative voltage region.

The negative charge pumping operation in step S1400 may be performed under the control of the control logic 190 during a period between t13 and t14 in FIG. 12 or a period between t13' and t14' in FIG. 14. For example, during a period between t13 and t14 or a period between t13' and t14', the control parts 744 and 765 of the negative voltage detector 74 and the negative voltage generator 76 may activate discharge operations of the discharge parts 743 and 763 in response to the negative voltage enable signal NV_EN applied from the control logic 190. Outputs (in particular, an output level of the negative voltage pump 75) of the negative voltage pump 75 and the negative voltage generator 76 may be discharged to a level lower than the reference voltage Vref_NEG. Consequently, a clock CLK_NEGP for a negative voltage pump is generated from the negative voltage detector 74, and the negative voltage pump 75 may perform a negative charge pumping operation.

In step S1500, there may be judged whether a negative charge pumping result of the negative voltage pump 75 is identical to or lower than the target negative voltage TNV2. If a negative charge pumping result of the negative voltage pump 75 is judged not to be identical to or lower than the target negative voltage TNV2, the negative charge pumping operation may be repeated until a negative charge pumping result of the negative voltage pump 75 is identical to or lower than the target negative voltage TNV2. If a negative charge pumping result of the negative voltage pump 75 is identical to or lower than the target negative voltage TNV2, in step S1600, the negative charge pumping operation may be stopped.

According to the above-described negative charge pumping operation, there may be generated a target negative voltage TNV2 having waveforms represented by A and A' in FIGS. 12 and 13. In this case, it is possible to stably obtain the second verification voltage Vvfy2 as the target negative voltage TNV2.

However, the inventive concept is not limited to generation of a target negative voltage TNV2 having waveforms represented by A and A' in FIGS. 12 and 13. For example, like waveforms B represented by a dotted line in FIGS. 12 and 13, a voltage transition from TNV1 to TNV2 may be made without negative charge pumping. The negative charge pumping operation may be performed to generate a negative voltage lower than a current voltage. No negative charge pumping may be made to generate the second verification voltage Vvfy2 being a negative voltage higher in level than the first verification voltage Vvfy1 being generated previously. A relatively slow discharge operation may be accomplished by a discharge path of a plurality of resistors R1_W to R5_W, not by a discharge part 763 in FIG. 5.

In this case, the second verification voltage Vvfy2 may have a stable level at t15, not at t14 (or, t14').

Each period for generating a negative voltage may be optimized to control a negative voltage generating operation efficiently.

Below, a negative voltage generating method is exemplarily described under the condition that negative verification voltages are generated in sequence.

However, the negative voltage generating method may be applied to various negative voltages (e.g., various negative word line voltages) and various positive word line voltages without limitation to a specific negative voltage (e.g., a verification voltage, a read voltage, etc.). According to a word line voltage generating method of the inventive concept, level conversion may be made with respect to negative and positive word line voltages rapidly. This may enable a program time to be reduced. Further, it is possible to efficiently perform read and verify operations about a data state distributed at negative and positive voltage regions.

FIG. 14 is a diagram illustrating threshold voltage distributions, verification voltages, and read voltages when threshold voltages of some memory cells are distributed at a negative voltage region.

In FIG. 14, a horizontal axis may represent threshold voltages of memory cells, and a vertical axis may represent the number of memory cells. In FIG. 14, there is exemplarily shown the case that memory cells have an erase state ST0 and first to seventh program states ST1 to ST7. However, the inventive concept is not limited thereto. Logical states ST0 to ST7 of memory cells and the number of logical states may be changed variously.

Since a flash memory device 100 is not rewritten, memory cells may be erased prior to a program operation. That is, memory cells may be set to have the erase state ST0 prior to programming. Memory cells may be distributed to have threshold voltage distributions in FIG. 14. This may be accomplished by erasing the memory cells so as to have threshold voltages (or, to be distributed within a threshold voltage distribution ST0) lower in level than an erase-verification voltage Vvfye. After erased to have the erase state ST0, memory cells may be programmed to have one of the first to seventh program states ST1 to ST7.

A flash memory device 100 may perform a program operation according to an incremental step pulse programming (ISPP) manner to exactly control a threshold voltage distribution. Memory cells may be programmed within a cycle formed of a plurality of program loops. Each program loop may be divided into a program period P and a program-verification period V.

During the program period P, memory cells may be programmed under a given bias condition. According to the ISPP manner, a program voltage applied during a program period P may stepwise increase at iteration of program loops. The program voltage may be a positive high voltage. In an exemplary embodiment, the program voltage may be generated from a high voltage generator 171 under the control of control logic 190.

During the program-verification period V, a verify-read operation may be made to judge whether memory cells are programmed to desired threshold voltages (e.g., ST0 to ST7). The program loops may be repeated within a given number until memory cells are programmed to desired threshold voltages. The verify-read operation may be performed using first to seventh verification voltages Vvfy1 to Vvfy7 each corresponding to the program states ST0 to ST7. The verify-read operation may be substantially identical to a normal read operation except that read data is not output to an external device.

After programming on memory cells is completed, a normal read operation may be carried out to read data of program states ST0 to ST7. At the normal read operation, the program states ST0 to ST7 may be discriminated using a plurality of read voltages Vrd1 to Vrd7 in FIG. 14.

In an exemplary embodiment, the first and second read voltages Vrd1 and Vrd2 may be a negative voltage. The second read voltage Vrd2 may be a negative voltage higher in level than the first read voltage Vrd1. The third to seventh read voltages Vrd3 to Vrd7 may be a positive voltage higher than the second read voltage Vrd2. The third to seventh read voltages Vrd3 to Vrd7 may be generated from a low voltage generator 173 under the control of the control logic 190. The first and second read voltages Vrd1 and Vrd2 may be generated from a negative voltage generator 175 under the control of the control logic 190.

In case of threshold voltage distributions in FIG. 14, the negative voltage generator 175 may be configured to generate the second read voltage Vrd2 without delay after generation of the first read voltage Vrd1 under the control of the control logic 190. Alternatively, the negative voltage generator 175 may be configured to generate the first read voltage Vrd1 after generation of the second read voltage Vrd2 under the control of the control logic 190. An order of generating read voltages to be applied at successive read operations may be determined variously under the control of the control logic 190.

For example, in the event that the second read voltage Vrd2 is generated without delay after generation of the first read voltage Vrd1, an output of the negative voltage generator 175, that is, the first read voltage Vrd1 may be discharged to a level, and then the second read voltage Vrd2 may be generated by a negative charge pumping operation. According to an exemplary embodiment of the inventive concept, switching of a negative voltage from a low negative voltage level to a high negative voltage level may be made rapidly.

In the event that the first read voltage Vrd1 is generated without delay after generation of the second read voltage Vrd2, the first read voltage Vrd1 may be generated via a negative charge pumping operation without a discharge operation of an output of the negative voltage generator 175, that is, the second read voltage Vrd2. According to the above description, a discharge operation may be selectively performed according to levels of negative read voltages generated in sequence. This means that different levels of negative voltages are generated rapidly.

It is possible to control periods (e.g., a discharge period, a pumping period, etc.) for generating negative and positive read voltages by an optimized time. The above-described read voltage characteristics may be applied to the normal read operation and a verify-read operation to be described below. Further, a method of generating a read voltage and a verify-read voltage may be applied to various word line voltages.

Figure 15:
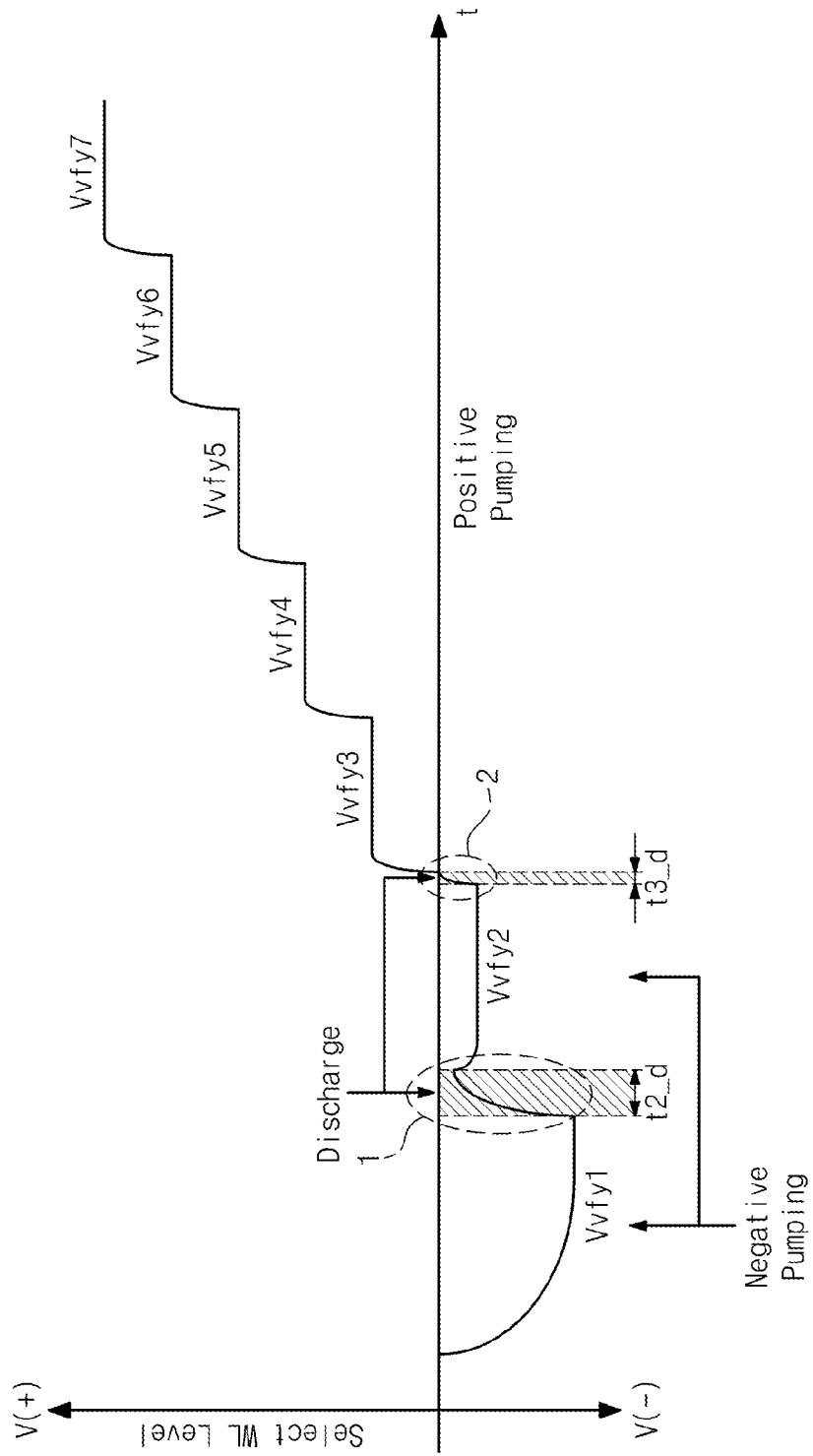
FIG. 15 is a diagram for describing a method of generating first to seventh verification voltages Vvfy1 to Vvfy7 each corresponding to program states ST0 to ST7 shown in FIG. 14.

FIG. 15 is a diagram for describing a method of generating first to seventh verification voltages Vvfy1 to Vvfy7 each corresponding to program states ST0 to ST7 in FIG. 14. FIG. 15 shows verification voltages Vvfy1 to Vvfy7 according to a 1-step verify scheme.

With the 1-step verify scheme, during a program-verification period V, a verify-read operation may be carried out once with respect to program states ST0 to ST7. In an exemplary embodiment, first and second verification voltages Vvfy1 and Vvfy2 used to program-verify the first and second program states ST1 and ST2 may be a negative voltage. The second verification voltage Vvfy2 may be a negative voltage higher in level than the first verification voltage Vvfy1. The third to seventh verification voltages Vvfy3 to Vvfy7 used to program-verify the third to seventh program states ST3 to ST7 may have positive low voltages different from one another. The third to seventh verification voltages Vvfy3 to Vvfy7 may be generated from a low voltage generator 173 under the control of control logic 190. The second verification voltage Vvfy2 may be generated from a negative voltage generator 175 under the control of control logic 190.

In case of the 1-step verify scheme, the negative voltage generator 175 may be configured to generate the second verification voltage Vvfy2 without delay after generation of the first verification voltage Vvfy1. After the second verification voltage Vvfy2 is generated, the low voltage generator 173 may sequentially generate the third to seventh verification voltages without delay.

To reduce a time taken to generate the second verification voltage Vvfy2 after generation of the first verification voltage Vvfy1, an output of the negative voltage generator 175 may be discharged during a given time rapidly, and then the second verification voltage Vvfy2 may be generated via a negative charge pumping operation. Further, to reduce a time taken to generate the third to seventh verification voltages Vvfy3 to Vvfy7 after generation of the second verification voltage Vvfy2, an output of the negative voltage generator 175 may be discharged during a given time rapidly, and then the third verification voltage Vvfy3 may be generated from the low voltage generator 173. After the third verification voltage Vvfy3 is generated, the low voltage generator 173 may sequentially generate the fourth to seventh verification voltages Vvfy4 to Vvfy7 without a discharge operation.

In particular, to efficiently generate negative voltages in sequence, periods 1 and 2 may be set to an optimized reference time Ref DT (e.g., t2_d and t3_d). Herein, during the period 1, a discharge operation may be carried out after the first verification voltage Vvfy1 is generated. During the period 2, a discharge operation may be carried out after the second verification voltage Vvfy2 is generated. The first verification voltage Vvfy1 may be discharged during the reference time t2_d prior to generation of the second verification voltage Vvfy2 without comparing an output level of the first verification voltage Vvfy1 with a discharged result of the first verification voltage Vvfy1.

In an exemplary embodiment, the reference times t2_d and t3_d set to the discharge periods 1 and 2 may be determined on the basis of a voltage difference between adjacent verification voltages within a period defined by the discharge periods 1 and 2. For example, if a voltage difference between the first verification voltage Vvfy1 and the second verification voltage Vvfy2 is larger than a voltage difference between the second verification voltage Vvfy2 and the third verification voltage Vvfy3, the reference time t2_d corresponding to the discharge period 1 may be set to be larger than the reference time t3_d corresponding to the discharge period 2.

In case of determining a reference time for discharging, the discharge time t3_d may be determined on the basis of a level difference between a negative voltage Vvfy2 and 0V. The discharge time t3_d may correspond to a time when a voltage transitions from a negative voltage region to a positive voltage region. Further, a positive voltage pumping time may be also set on the basis of a target positive voltage Vvfy3 and 0V.

During a period where the third verification voltage Vvfy3 being a positive voltage is generated after providing of the second verification voltage Vvfy2, firstly, a negative voltage may be discharge to a ground level, and then positive charge pumping may be made. That is, a previously generated voltage, that is, the second verification voltage Vvfy2 may be discharged to a ground level (or, 0V), and then positive charge pumping for providing the third verification voltage Vvfy3 may be performed.

A control manner for setting each discharge period to an optimized reference time value may be also applied to a negative charge pumping period. In an exemplary embodiment, a negative charge pumping period may be set to the same reference time Ref PT or to different values. Reference time values Ref DT and Ref PT set to the negative charge pumping period and each discharge period can be determined using a result simulated by a maker. The reference time values Ref DT and Ref PT may be varied within a predetermined range on the basis of a program/erase cycle of a flash memory device, a temperature, etc.

Herein, the reference times t2_d, t3_d, Ref DT, and Ref PT may be determined referring to various factors acquired at a test process. The reference times t2_d, t3_d, Ref DT, and Ref PT determined considering various factors may be set by fuse programming or initial data. With the above description, periods for generating negative and positive verification voltages in sequence may be controlled to an optimized time, so that a program verification speed is improved.

Figure 16:
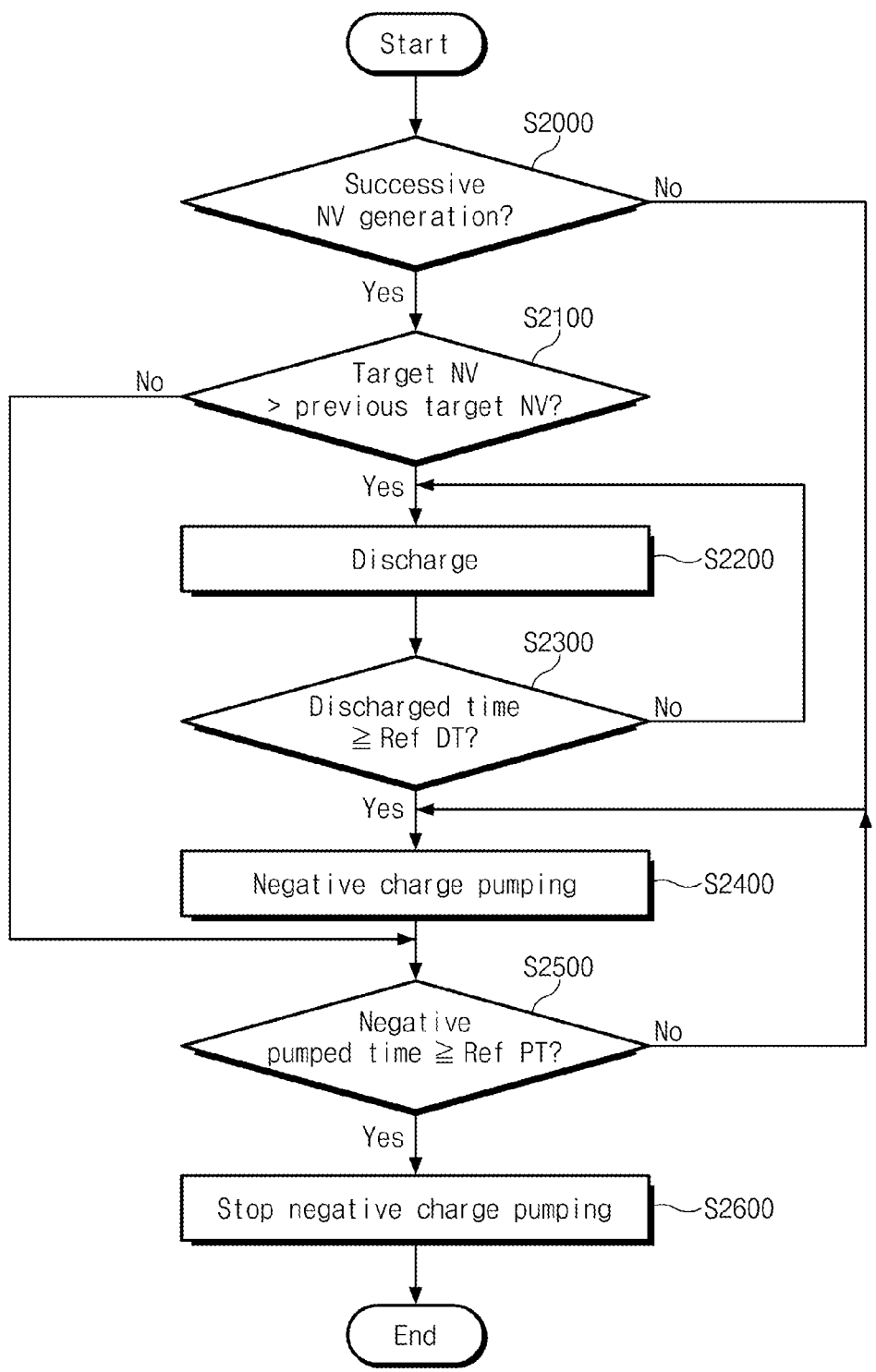
FIG. 16 is a flowchart for describing a negative voltage generating method according to an exemplary embodiment of the inventive concept.
Figure 17:
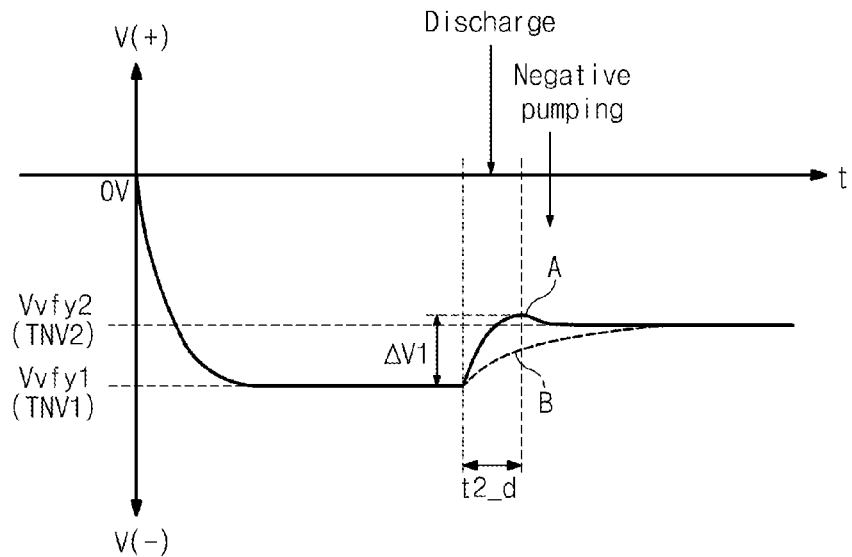
FIGS. 17 and 18 are diagrams illustrating waveforms of negative voltages generated according to a negative voltage generating method.
Figure 18:
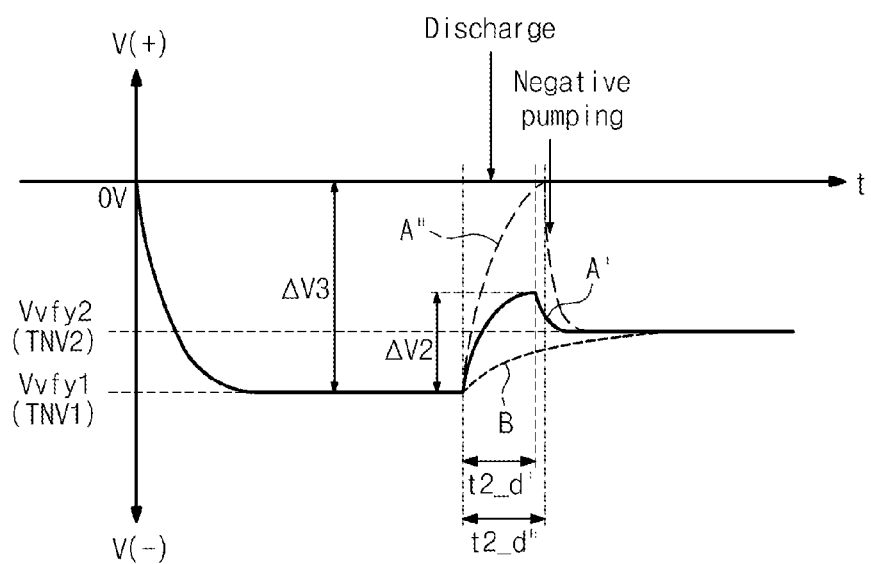

FIG. 16 is a flowchart for describing a negative voltage generating method according to an exemplary embodiment of the inventive concept. FIGS. 17 and 18 are diagrams illustrating waveforms of negative voltages generated according to a negative voltage generating method. FIGS. 17 and 18 exemplarily show waveforms of first and second verification voltages Vvfy1 and Vvfy2 described in FIGS. 14 and 15. However, negative voltage types and levels are not limited thereto.

Referring to FIG. 16, in step S2000, there may be judged whether a negative voltage is generated successively. Whether a negative voltage is generated successively may be determined by control logic 190 which controls program, erase, and read operations of a flash memory device 100.

If a negative voltage is judged not to be generated successively, the method proceeds to step S2400, in which a negative charge pumping operation may be made. The case that a negative voltage is not generated successively may include cases that a first level of a negative voltage is generated, that different levels of negative voltages are generated discontinuously, and the like. Discontinuously generated negative voltages may include negative read voltages Vrd1 and Vrd2 in FIG. 14.

In step S2500, there may be judged whether a negative charge pumping time is identical to or more than a reference time Ref PT. If a negative charge pumping time is less than the reference time Ref PT, the negative charge pumping operation may be repeated until the negative charge pumping time reaches the reference time Ref PT. If the negative charge pumping time is identical to or more than a reference time Ref PT, in step S2600, the negative charge pumping operation may be stopped.

If the negative voltage is judged to be generated successively, in step S2100, there may be judged whether a target negative voltage is higher than a previous target negative voltage corresponding to a just previously generated negative voltage. The case that a negative voltage is generated successively may include the case that a second verification voltage Vvfy2 is generated without delay after generation of a first verification voltage Vvfy1, as illustrated in FIG. 15, for example.

If the target negative voltage is higher than the previous target negative voltage, in step S2200, an output of a negative voltage generator 175, that is, the first verification voltage Vvfy1 may be discharged via discharge parts 743 and 763 during a reference time Ref DT. Discharging of the output of the negative voltage generator 175 may be controlled by controlling discharge operations of the discharge parts 743 and 763 according to a discharge control signal DS generated from control logic 190. A discharge operation in step S2200 will be more fully described below.

In FIGS. 17 and 18, a previous target negative voltage TNV1 may correspond to the first verification voltage Vvfy1, and a new target negative voltage TNV2 may correspond to the second verification voltage Vvfy2. Herein, the second verification voltage Vvfy2 may be a negative voltage higher than the first verification voltage Vvfy1. Under the control of the control logic 190, the target negative voltages TNV1 and TNV2 may be set and updated to the negative voltage generator 175 in a reference voltage (Vref_NEG) type according to a generation order and levels of negative voltages needed for erase, program, and read operations executed at a flash memory device.

In the event that the first verification voltage Vvfy1 is generated and the second verification voltage Vvfy2 is generated successively, the control logic 190 may change a target negative voltage, set or to be provided to the negative voltage generator 175, from TNV1 to TNV2. In this case, during the reference time Ref DT, an output of the negative voltage generator 175 may be discharged via the discharge parts 743 and 763 under the control of the control logic 190.

If an output of the negative voltage generator 175 is not discharged during the reference time Ref DT, a word line supplied with the first verification voltage Vvfy1 may maintain a state charged with the first verification voltage Vvfy1 like a capacitor. In this case, a discharge operation and a negative charge pumping operation may not be carried out at a negative voltage transition from the first verification voltage Vvfy1 to the second verification voltage Vvfy2. The reason is because the negative charge pumping operation is carried out when a negative voltage lower in level than a current voltage is generated. Upon generating of the second verification voltage Vvfy2 being a negative voltage higher in level than a previously generated voltage, that is, the first verification voltage Vvfy1, a slow transition characteristic may be obtained like a graph (represented by a dotted line) B in FIGS. 17 and 18, instead of the negative charge pumping. In this case, a lot of time may be spent during a transition from the first verification voltage Vvfy1 to the second verification voltage Vvfy2.

According to an exemplary embodiment of the inventive concept, upon a negative voltage transition from the first verification voltage Vvfy1 to the second verification voltage Vvfy2, an output of the negative voltage generator 175 may be rapidly discharged via the discharge parts 743 and 763 during a time, without waiting until a voltage charged at a word line by the first verification voltage Vvfy1 is discharged slowly (referring to solid lines A, A', and A" in FIGS. 17 and 18). Accordingly, a negative voltage transition may be made with rapid speed.

During a discharge operation, an output of the negative voltage generator 175 may be discharged either to a level between a target negative voltage TNV2 and a ground voltage or to a ground level fully. A discharge level of an output of the negative voltage generator 175 may be controlled by adjusting discharge times t2_d, t2_d', and t2_d" or by adjusting discharge magnitudes ΔV1, ΔV2, and ΔV3. The magnitudes ΔV1, ΔV2, and ΔV3 may be changed variously within a voltage range from a level higher than the target negative voltage TNV2 to a level identical to or lower than a ground voltage. For example, as a voltage difference between adjacent negative voltages placed between discharge periods becomes large, a discharge time may be set to a long time. As a voltage difference between adjacent negative voltages placed between discharge periods becomes small, a discharge time may be set to a short time.

Returning to FIG. 16, in step S2300, there may be judged whether a time taken to perform a discharge operation is identical to or longer than the reference time Ref DT. If the time taken to perform a discharge operation is shorter than the reference time Ref DT, the discharge operation may be repeated until the time taken to perform a discharge operation is identical to the reference time Ref DT. If the time taken to perform a discharge operation is identical to or longer than the reference time Ref DT, the discharge operation may be stopped. In step S2400, a negative charge pumping operation may be carried out during the reference time Ref PT under the control of the control logic 190.

In step S2500, there may be judged whether a time taken to perform a negative charge pumping operation is identical to or longer than the reference time Ref PT. If a time taken to perform a negative charge pumping operation is shorter than the reference time Ref PT, the negative charge pumping operation may be repeated until the time taken to perform a negative charge pumping operation reaches the reference time Ref PT. If the time taken to perform a negative charge pumping operation is identical to or longer than the reference time Ref PT, in step S2600, the negative charge pumping operation may be stopped.

A method of generating a negative verification voltage is exemplarily described. However, the inventive concept is not limited thereto. For example, a technique of controlling each period (e.g., a discharge period, a pumping period, etc.) for generating a negative verification voltage in an optimized time may be applied to operations of generating various negative and positive word line voltages.

Figure 19:
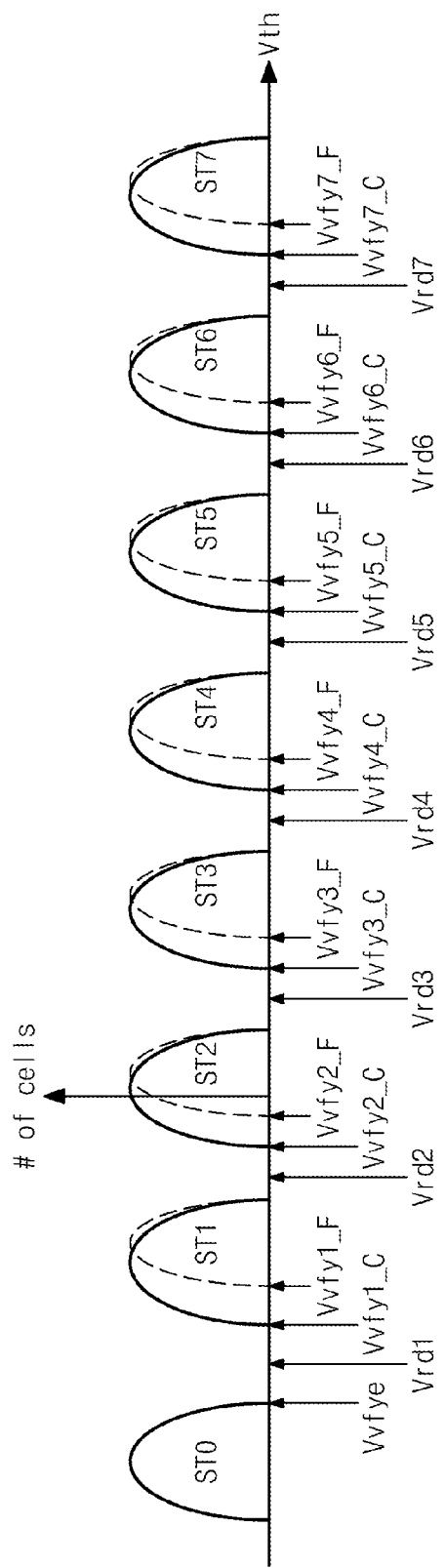
FIG. 19 is a diagram illustrating threshold voltage distributions, verification voltages, and read voltages when threshold voltages of some memory cells are distributed at a negative voltage region.
Figure 20:
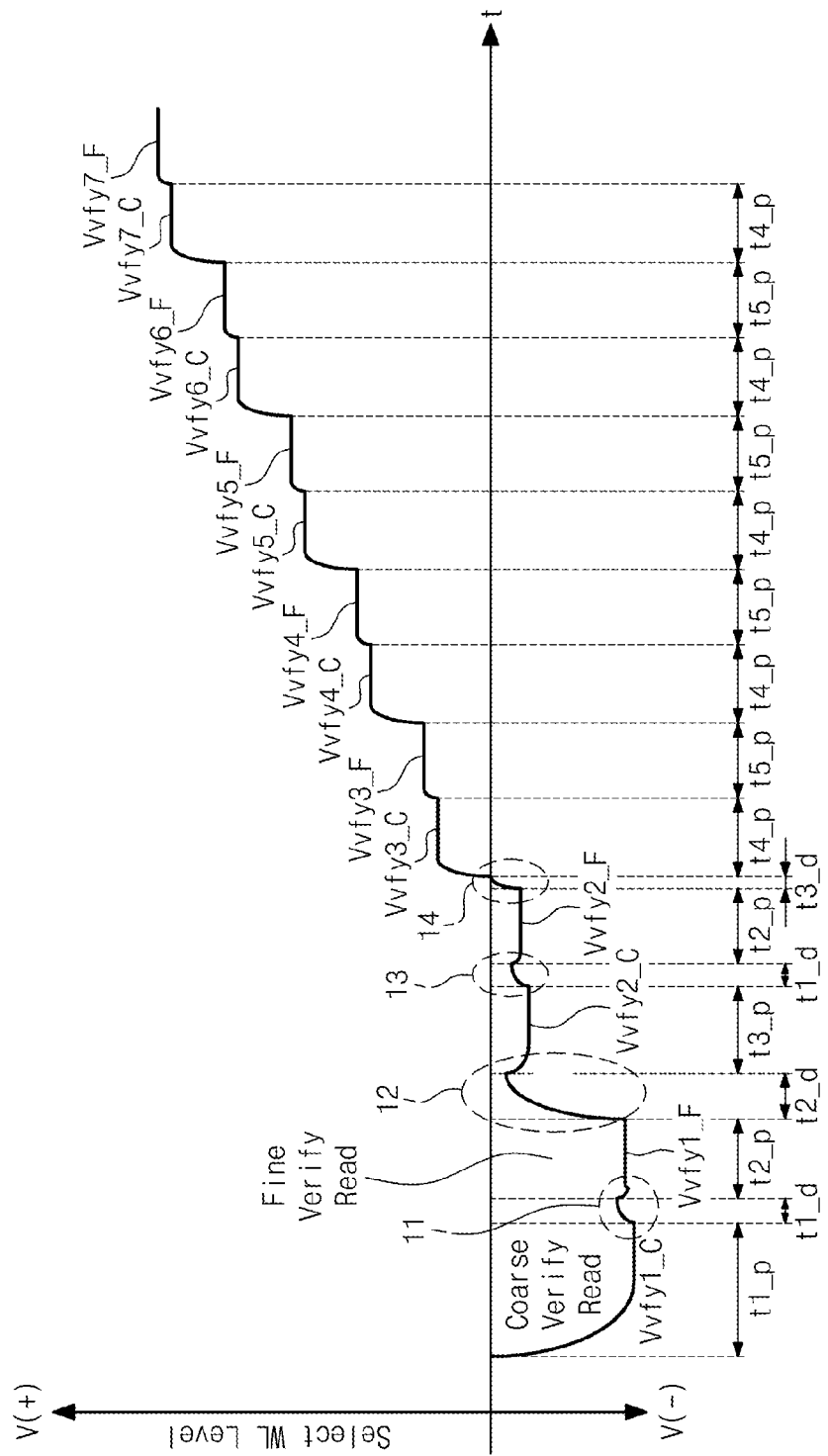
FIG. 20 is a diagram illustrating first to seventh pre-verification voltages Vvfy1_C to Vvfy7_C and first to seventh main verification voltages Vvfy1_F to Vvfy7_F associated with program states ST0 to ST7.

FIG. 19 is a diagram illustrating threshold voltage distributions, verification voltages, and read voltages when threshold voltages of some memory cells are distributed at a negative voltage region. FIG. 20 is a diagram illustrating first to seventh pre-verification voltages Vvfy1_C to Vvfy7_C and first to seventh main verification voltages Vvfy1_F to Vvfy7_F associated with program states ST0 to ST7.

In FIGS. 19 and 20, there is exemplarily shown a 2-step verify-read operation in which a verify-read operation is performed twice with respect to each of program states ST0 to ST7 during a program-verify period V. However, the number of verify-read operations applied to each program state is not limited thereto.

Referring to FIGS. 19 and 20, according to the 2-step verify-read operation, whether a threshold voltage of a programmed memory cell exists within each program state may be judged by performing a first verify-read operation using a pre-verification voltage Vvfy_C of each program state and a second verify-read operation using a main verification voltage Vvfy_F of each program state.

If program fail is generated at the first verify-read operation and/or the second verify-read operation, a program loop may be repeated within a given number until memory cells are all program passed. In an exemplary embodiment, the pre-verification voltage Vvfy_C may be lower in level than the main verification voltage Vvfy_F. The first verify-read operation using the pre-verification voltage Vvfy_C may be called a coarse verify operation, and the second verify-read operation using the main verification voltage Vvfy_F may be called a fine verify operation.

The 2-step verification manner may be applied to a program operation when a shift of a threshold voltage is large or to control a threshold voltage distribution finely. It is possible to use a 1-step verification manner in FIGS. 14 and 15 and a 2-step verification manner in FIGS. 19 and 20 in combination. A verification manner applied to the inventive concept may not be limited to a specific case.

Generation of the verification voltages Vvfy1_C to Vvfy7_C and Vvfy1_F to Vvfy7_F in FIG. 20 may be made in the same manner as that of verification voltages Vvfy1 to Vvfy7 in FIG. 15 except that two verification voltages are associated with each of the program states ST1 to ST7.

Four discharge periods 11 to 14 may end when the verification voltages Vvfy1_C to Vvfy7_C and Vvfy1_F to Vvfy7_F are generated.

In an exemplary embodiment, reference times t1_d, t2_d, and t3_d set to discharge periods 11 to 14 may be determined on the basis of a difference between adjacent verification voltages placed between the discharge periods 11 to 14. For example, the discharge periods 11 and 13 between verification voltages applied to the same negative program state may be set to have the first discharge time t1_d. The discharge period 12 between verification voltages applied to different negative program states may be set to have the second discharge time t2_d. The discharge period 14 between verification voltages applied to negative and positive program states may be set to have the third discharge time t3_d.

In this embodiment, the first to third discharge times t1_d to t3_d may be different. For example, the first discharge time t1_d may be set to the smallest value, and the third discharge time t3_d may be set to have a value identical to or larger than the first discharge time t1_d. The second discharge time t2_d may be set to have a value identical to or larger than the third discharge time t3_d. However, the first to third discharge times t1_d to t3_d may be determined variously, not limited to this disclosure.

A technique of setting each discharge period to an optimized reference time value may be also applied to a negative charge pumping period and a positive charge pumping period.

In an exemplary embodiment, a negative charge pumping period can be set to have the same reference time Ref PT, or may be set to have different values according to types and levels of negative verification voltages as illustrated in FIG. 20. For example, a negative voltage pumping period associated with a first negative verification voltage Vvfy1_C may be set to have a first pumping time t1_p. Negative voltage pumping periods associated with fine negative verification voltages Vvfy1_F and Vvfy2_F may be set to have a second pumping time t2_p. A negative voltage pumping period associated with a coarse negative verify-read voltage Vvfy2_C other than the first negative verification voltage Vvfy1_C may be set to have a third pumping time t3_p. Positive voltage pumping periods associated with coarse positive verify-read voltages Vvfy3_C to Vvfy7_C may be set to have a fourth pumping time t4_p. Positive voltage pumping periods associated with fine positive verify-read voltages Vvfy3_F to Vvfy7_F may be set to have a fifth pumping time t5_p.

Negative and positive charge pumping periods may be determined on the basis of a voltage difference between adjacent verification voltages which a pumping period exists between. Accordingly, the first pumping time t1_p may be largest. At the first pumping time t1_p, a voltage difference between adjacent verification voltages may be largest. The second or fifth pumping time t2_p or t5_p may be smallest. At the second or fifth pumping time t2_p or t5_p, a voltage difference between adjacent verification voltages may be smallest.

Reference time values Ref DT and Ref PT set to each negative charge pumping period, each discharge period, and each positive charge pumping period can be determined using a result simulated by a maker. The reference time values Ref DT and Ref PT may be varied within a predetermined range on the basis of a program/erase cycle of a flash memory device, a temperature, etc.

According to the above description, it is possible to control each period associated with successive generation of negative and positive verification voltages with an optimized time, so that a program-verify speed is improved. If a negative voltage generating period of a negative voltage generator 175 is controlled only according to the reference time Ref PT set to the negative voltage pumping period, a voltage detector 74 can be removed from the negative voltage generator 175. Accordingly, it is possible to simplify a negative charge pumping circuit and a control method thereof. This means that a negative charge pumping operation is efficiently made within an optimized time.

According to the above-described negative voltage generating method, a negative charge pumping operation accompanying a discharge operation and a negative charge pumping operation not accompanying a discharge operation may be made selectively according to levels of successively generated negative voltages. There is exemplarily described the case that a negative charge pumping operation accompanying a discharge operation is performed. The case that a negative charge pumping operation not accompanying a discharge operation is performed will be more fully described with reference to FIGS. 21 to 23.

Figure 21:
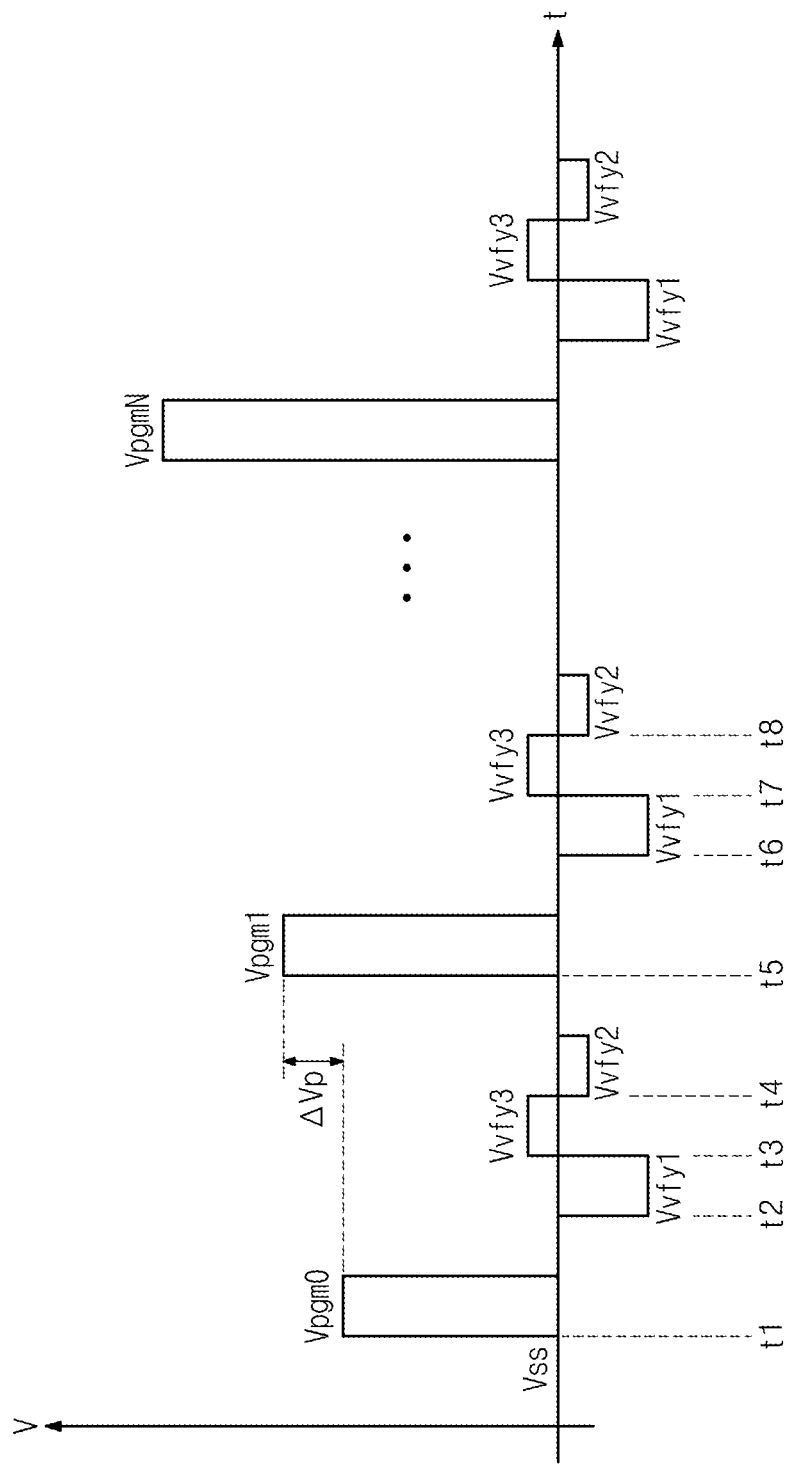
FIG. 21 is a diagram for describing a word line voltage generating method according to an exemplary embodiment of the inventive concept.

FIG. 21 is a diagram for describing a word line voltage generating method according to an exemplary embodiment of the inventive concept.

As compared with verification voltages in FIG. 10, the diagram in FIG. 21 may be identical to that in FIG. 10, except that a second verification voltage Vvfy2 and a third verification voltage Vvfy3 are exchanged. Thus, description thereof is omitted.

Referring to FIG. 21, at least two or more negative voltages (e.g., Vvfy1 and Vvfy2) having different levels (generated from a negative voltage generator 175) and a positive low voltage (e.g., Vvfy3) (generated from a low voltage generator 173) may be applied to a selected word line in turn. For example, at programming, the first verification voltage Vvfy1 having a negative level generated from the negative voltage generator 175 may be applied to a selected word line to verify programmed memory cells. At this time, like a capacitor, negative charges may be charged at a word line according to the first verification voltage Vvfy1. In the case of this inventive concept, the third verification voltage Vvfy3 having a positive voltage level may be applied to a selected word line instantly without waiting until a negative voltage charged at the selected word line after applying of the first verification voltage Vvfy1 is discharged slowly. The third verification voltage Vvfy3 may be applied to the selected word line to verify memory cells programmed to have the third program state ST3.

In this case, a negative voltage charged at the selected word line due to the first verification voltage Vvfy1 may be discharged to a ground level or a level higher than the first verification voltage Vvfy1, by the third verification voltage Vvfy3 having a positive voltage level. As a negative voltage charged at the selected word line is discharged to a ground level or a level higher than the first verification voltage Vvfy1, a negative voltage pump of the negative voltage generator 175 may be activated instantly at generation of the second verification voltage Vvfy2. Accordingly, the second verification voltage Vvfy2 may be rapidly generated by a negative voltage pumping operation of the negative voltage generator 175. The second verification voltage may be applied to the selected word line to verify memory cells programmed to have the second program state ST2.

According to the above-described word line voltage generating method, it is possible to obtain the same effect as a word line recovery operation by generating a negative voltage and a positive voltage in turn (or, by adjusting an order of generating word line voltages), without a word line recovery operation for discharging charges charged at a word line. Accordingly, negative word line voltages may be generated successively without a word line recovery operation. This means that level conversion on a negative word line voltage may be made rapidly.

Figure 22:
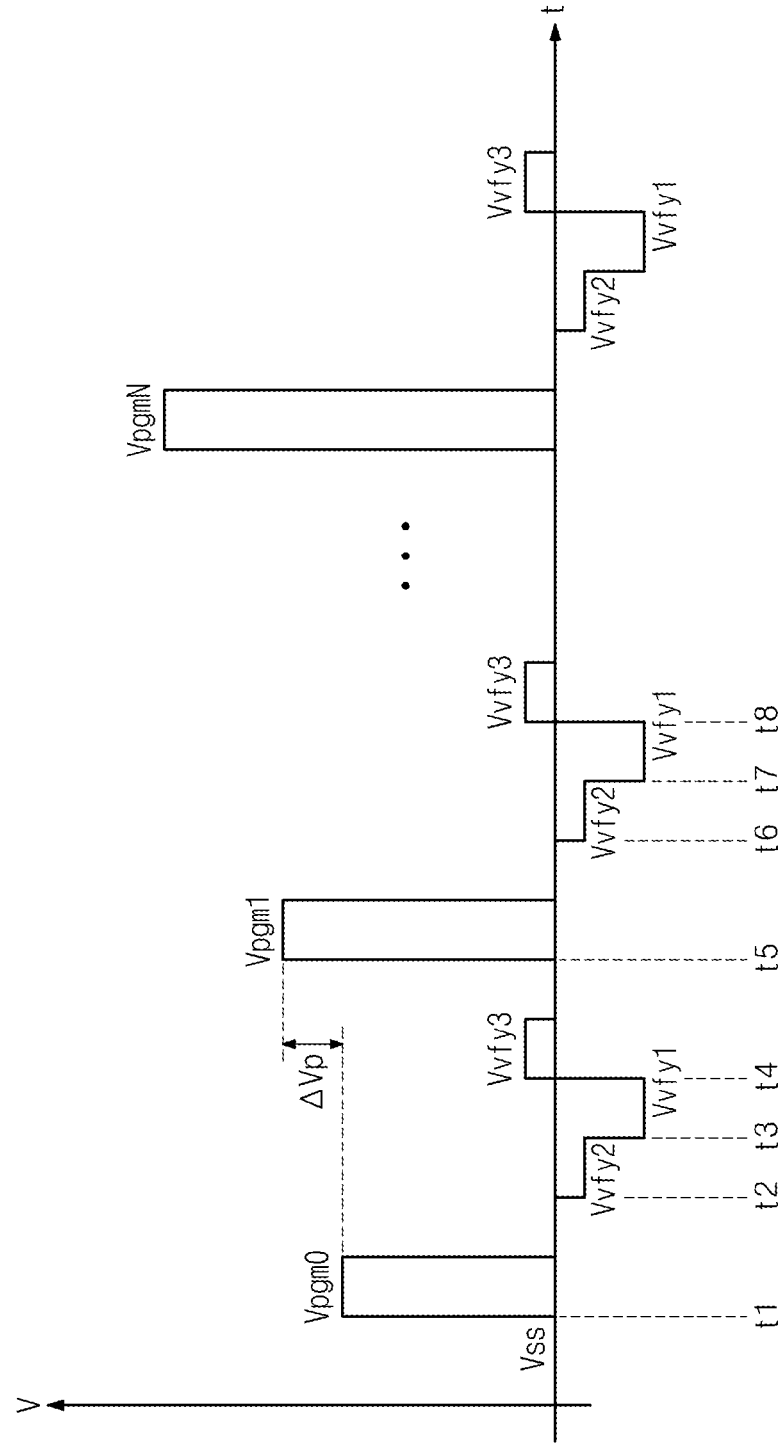
FIG. 22 is a diagram for describing a word line voltage generating method according to another exemplary embodiment of the inventive concept.

FIG. 22 is a diagram for describing a word line voltage generating method according to another exemplary embodiment of the inventive concept.

As compared with verification voltages in FIG. 10, the diagram in FIG. 22 may be identical to that in FIG. 10, except that a first verification voltage Vvfy1 and a second verification voltage Vvfy2 are exchanged. Thus, description thereof is omitted.

Referring to FIG. 22, in the event that at least two or more negative voltages having different levels are generated successively, a negative voltage generator 175 may determine a negative voltage generation order such that a negative voltage (e.g., a second verification voltage Vvfy2) having a relatively high level is generated prior to a negative voltage (e.g., a first verification voltage Vvfy1) having a relatively low level. In this case, when a negative voltage transitions from the second verification voltage VVfy2 to the first verification voltage Vvfy1, a negative charge pumping operation may be carried out instantly without a discharge operation. According, a negative voltage transition may be made rapidly.

Figure 23:
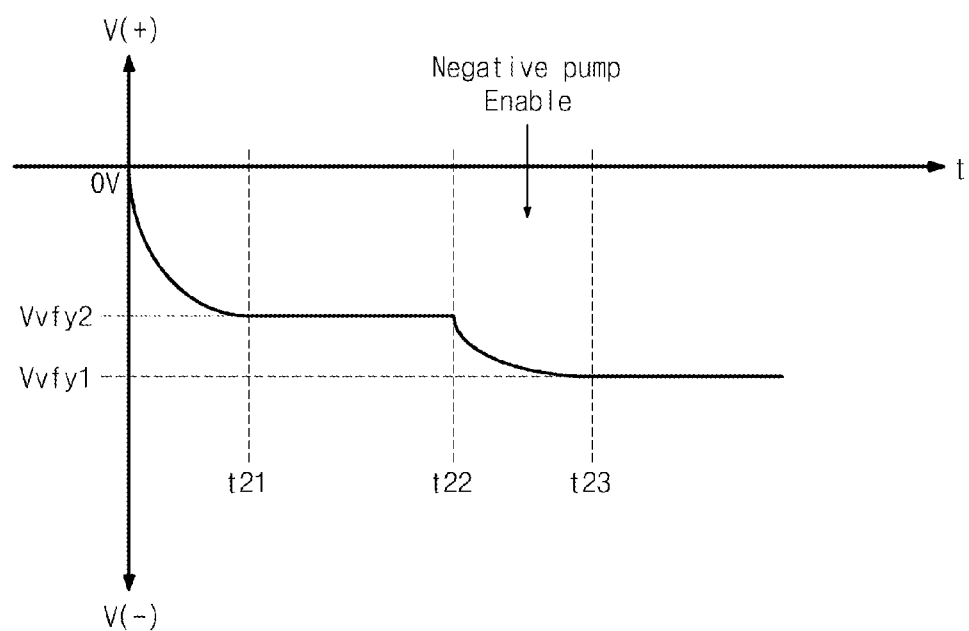
FIG. 23 is a diagram for describing a first verification voltage Vvfy1 and a second verification voltage Vvfy2 shown in FIG. 22.

FIG. 23 is a diagram for describing a first verification voltage Vvfy1 and a second verification voltage Vvfy2 shown in FIG. 22. Levels and generation order of first and second verification voltages Vvfy1 and Vvfy2 may be determined variously.

Levels of the first and second verification voltages Vvfy1 and Vvfy2 in FIGS. 22 and 23 may be identical to those in FIGS. 10 and 21. However, a generation order of the first and second verification voltages Vvfy1 and Vvfy2 may be different from that in FIGS. 10 and 21.

For example, the second verification voltage Vvfy2 may be firstly generated, and then the first verification voltage Vvfy1 lower in level than the second verification voltage Vvfy2 may be generated. In this case, since a negative voltage transitions from a high negative voltage level to a low negative voltage level, a negative charge pumping operation may be activated whenever a negative voltage having a low level is generated, without a discharge operation or a word line recovery operation. Accordingly, it is possible to successively generate a negative word line voltage without a discharge operation or a word line recovery operation. This means that level conversion of negative word line voltages may be made rapidly.

The inventive concept is exemplarily described using the first and second verification voltages Vvfy1 and Vvfy2 among negative voltages generated from the negative voltage generator 175. However, a negative voltage generating method according to an exemplary embodiment of the inventive concept can be applied to all operations of generating negative word line voltages having different levels, without limitation to a specific case or a specific negative voltage number. Further, the inventive concept is exemplarily described using the case that a negative voltage is used as a word line voltage. However, a negative voltage generated according to the inventive concept may be uses as various voltages, for example, a well voltage, a bit line voltage, and the like.

As described above, to generate a negative voltage rapidly, a negative voltage generation order of the negative voltage generator 175 may be determined according to levels of negative voltages to be generated, without a discharge operation or a word line recovery operation. According to this word line voltage generating method, it is possible to obtain the same effect as a word line recovery operation by adjusting an order of generating word line voltages, without a discharge operation or a word line recovery operation. Accordingly, negative word line voltages may be generated successively without a discharge operation or a word line recovery operation. This means that level conversion on a negative word line voltage may be made rapidly. In this case, the negative voltage generator 175 may not include circuit elements associated with a discharge operation or a word line recovery operation. Accordingly, it is possible to simplify the negative voltage generator and a voltage generating unit 170 including the same.

Figure 24:
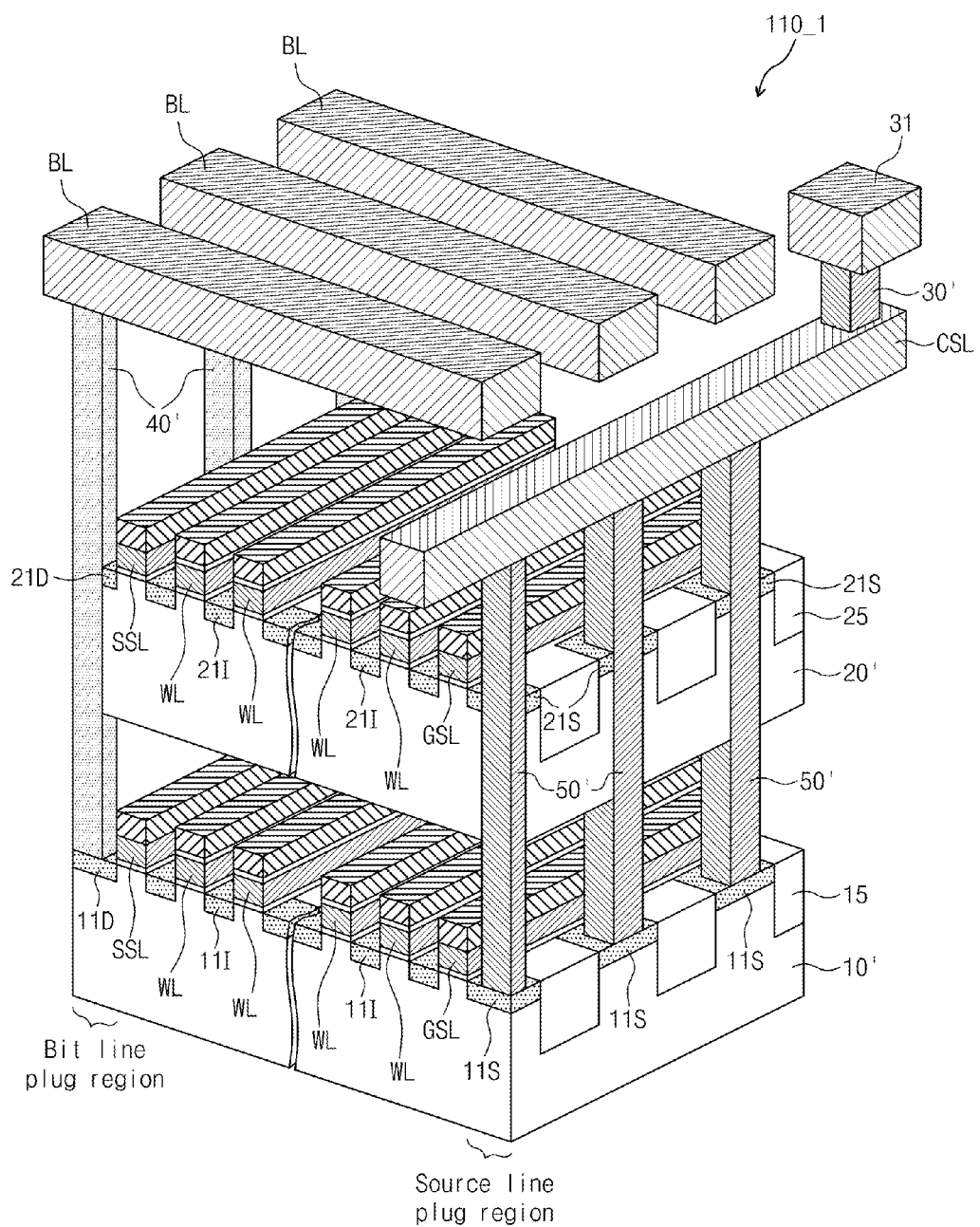
FIG. 24 is a perspective view of a memory cell array according to an exemplary embodiment of the inventive concept.

FIG. 24 is a perspective view of a memory cell array according to an exemplary embodiment of the inventive concept. A cell array 110_1 having a stack flash structure is exemplarily shown in FIG. 24.

Referring to FIG. 24, a flash memory device according to an exemplary embodiment of the inventive concept may include memory cells which are arranged in three dimensions. Memory cells may be formed at a plurality of semiconductor layers which are used as a semiconductor substrate for forming MOS transistors, respectively. For convenience of description, two semiconductor layers, that is, a first semiconductor layer 10' and a second semiconductor layer 20' are exemplarily shown in FIG. 24. However, the number of semiconductor layers is not limited thereto. For example, three or more semiconductor layers can be stacked.

In this embodiment, the first semiconductor layer 10' may be a single crystal silicon wafer, and the second semiconductor layer 20' may be a single crystal silicon epitaxial layer formed by an epitaxial process in which the first semiconductor layer 10', that is, a wafer is used as a seed layer. In this embodiment, each of the semiconductor layers 10' and 20' may have a cell array of the same structure. The memory cells may constitute a multi-level cell array 110_1.

Each of the semiconductor layers 10' and 20' may include active regions defined by device isolation patterns 15. The active regions may be formed in parallel along a direction. The device isolation patterns 15 may be formed of insulation materials including a silicon oxide film to electrically isolate the active regions.

A gate structure crossing the active regions may be disposed on each of the semiconductor layers 10' and 20'. The gate structure may be formed of a pair of selection lines GSL and SSL and M word lines WL. Source plugs 50' may be disposed at one side of the gate structure, and bit line plugs 40' may be disposed at the other side thereof. The bit line plugs 40' may be connected with N bit lines BL crossing the word lines WL, respectively. The bit lines BL may be formed above the uppermost semiconductor layer (e.g., the second semiconductor layer 20' in FIG. 24) so as to cross the word lines WL. N indicating the number of bit lines BL may be an integer of 1 or more. For example, N may be one of multiples of 8.

The word lines WL may be disposed between the selection lines GSL and SSL, and one gate structure may be formed of M word lines (M being an integer of 1 or more). For example, M may be one of multiples of 8. One of the selection lines GSL and SSL may be used as a ground selection line GSL which controls electric connection between a common source line CSL and memory cells. The other thereof may be used as a string selection line SSL which controls electric connection between bit lines and memory cells.

Impurity regions may be formed within active regions defined by the selection lines and the word lines. Impurity regions 11S and 21S formed at one sides of the ground selection lines GSL may be used as source electrodes connected by the common source lines CSL, and impurity regions 11D and 21D formed at one sides of the string selection lines SSL may be used as drain electrodes connected with bit lines BL via bit line plugs 40'. Impurity regions 11I and 21I formed at both sides of the word lines WL may be used as inner impurity regions for connecting memory cells in series.

Source plugs 50' may connect the impurity regions 11S and 21S (hereinafter, referred to as first and second source regions) with the semiconductor layers 10' and 20'. This means that the first and second source regions 11S and 21S have the same potential as the semiconductor layers 10' and 20'. This electric connection may be accomplished by connecting the source plugs 50' with the first source regions 11S via the second semiconductor layer 20' and the second source regions 21S. The source plugs 50' may contact with inner walls of the second source regions 21S and the second semiconductor layer 20'.

A voltage generating method according to an exemplary embodiment of the inventive concept may be applied to a flash memory device with the stack flash structure shown in FIG. 24. In case of the inventive concept, a negative voltage and a positive voltage may be applied to the flash memory device in FIG. 24 as word line voltages. Further, a negative voltage generating method according to an exemplary embodiment of the inventive concept may be applied to a three-dimensional flash memory cell structure in which memory cells are arranged in three dimensions. The three-dimensional flash memory device may be implemented not by repeating a method of forming memory cells in two dimensions, but by forming word lines or word line plates using a patterning process for defining active regions. Accordingly, it is possible to reduce a bit-per-fabrication cost.

Figure 25:
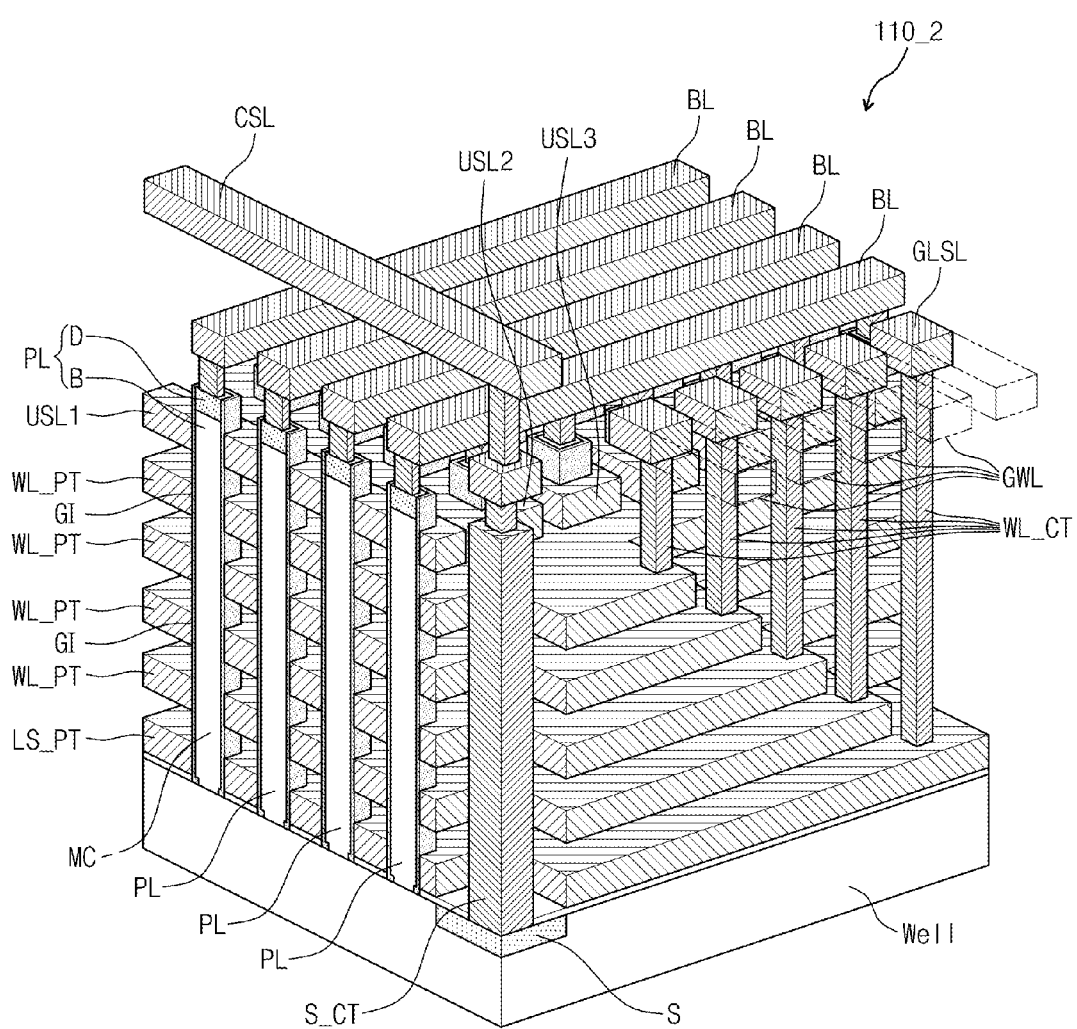
FIG. 25 is a perspective view of a memory cell array according to another exemplary embodiment of the inventive concept.

FIG. 25 is a perspective view of a memory cell array according to another exemplary embodiment of the inventive concept. A cell array 110_2 having a three-dimensional flash structure is exemplarily illustrated in FIG. 25.

Referring to FIG. 25, a cell array 110_2 of a flash memory device may include a plurality of word line plates WL_PT and a plurality of active pillars (or, active regions) PL arranged to cross the plurality of word line plates WL_PT. The plurality of word line plates WL_PT may be electrically isolated from one another. A semiconductor substrate may include a well region and a source region S. The source region S may have a conductivity type different from the well region. For example, the well region may be p-type, and the source region S may be n-type. In this embodiment, the well region may have a pocket well structure (or, called a triple well structure). With the pocket well structure, the well region may be surrounded by at least another well region (now shown) having a conductivity type different from the well region.

Each word line plate WL_PT can be formed of a plurality of local word lines which are electrically connected in common coplanarly to have the same potential. The word line plates WL_PT may be electrically separated by interlayer insulation films (not shown), respectively. The word line plates WL_PT may be electrically connected with electrically isolated global word lines GWL via word line contacts WL_CT, respectively. The word line contacts WL_CT may be formed at edges of a memory cell array or array bocks. In this embodiment, widths of the word line plates WL_PT and locations of the word line contacts WL_CT may be changed variously.

Each active pillar PL may include a body portion B adjacent to the well region; and a drain region D adjacent to an upper selection line USLi (i being an integer of N or less). The body portion B may have the same conductivity type as the well, and the drain region D may have a conductivity type different from the well region. The plurality of active pillars PL may have long axes formed to penetrate the plurality of word line plates WL_PT. Intersections of the word line plates WL_PT and the active pillars PL may be distributed in three dimensions. That is, memory cells in a three-dimensional memory may be formed by three-dimensionally distributed intersections. A gate insulation film GI may be disposed between a word line plate WL_PT and an active pillar PL. In this embodiment, the gate insulation film GI may be formed of multiple layers. For example, the gate insulation film GI may be formed of Oxide-Nitride-Oxide (ONO). A part of the gate insulation film GI may be used as a thin film (i.e., a charge storage film or layer) for storing information.

One ends of the active pillars PL may be connected in common with the well region, and the other ends thereof may be connected with bit lines BL. One bit line BL may be connected with a plurality of, for example, N active pillars PL. This means that one bit line BL is connected with a plurality of, for example, N cell strings CSTR. One active pillar PL may form one cell string CSTR. One cell string CSTR may include a plurality of memory cells formed at the plurality of word line plates WL_PT. One memory cell may be defined by one active pillar PL and one local word line or one word line plate WL_PT.

One cell string CSTR (i.e., one active pillar PL) may be selected independently to program each memory cell and to read data therefrom. A plurality of upper selection lines USLi may be disposed between the bit lines BL and the uppermost word line plate WL_PT. The upper selection lines USLi may be disposed to cross the bit lines BL. The bit lines BL may be electrically connected with the drain regions D via plugs. Alternatively, the bit lines BL may be electrically connected directly with the drain regions D.

A plurality of upper selection transistors for controlling electric connection between active pillars PL and bit lines BL may be formed at intersections of the bit lines BL and the upper selection lines USLi, respectively. Gate electrodes of the upper selection transistors may be connected with corresponding upper selection lines USLi. One active pillar PL (i.e., one cell string CSTR) may be selected independently by one bit line BL and one upper selection line USLi.

As illustrated in FIG. 25, a source region S may be formed within the well region. The source region S may form a charge path to/from a bit line. The source region S may be electrically connected with the common source line CSL. A source contact plug S_CT penetrating the word line plates WL_PT may be interposed between the common source line CSL and the source region S. The common source line CSL may be disposed above the bit lines BL via the source line contact plug S_CT, and may be formed of a metallic material. However, the common source line CSL can be formed to have various shapes.

To control a charge path to/from a bit line, a plurality of lower selection lines for controlling electric connection between the active pillars PL and the well region may be disposed between the well region and the lowermost word line plate WL_PT. In this embodiment, the plurality of lower selection lines LSL may form a lower selection plate LS_PT having an equivalent potential. The lower selection lines may be applied to gate electrodes of lower selection transistors to control electric connection between active pillars PL and the well region. A voltage generating method according to an exemplary embodiment of the inventive concept may be applied to the above-described three-dimensional flash memory. Negative and positive word line voltages generated according to an exemplary embodiment of the inventive concept may be applied to word line plates of the flash memory in FIG. 25.

Figure 26:
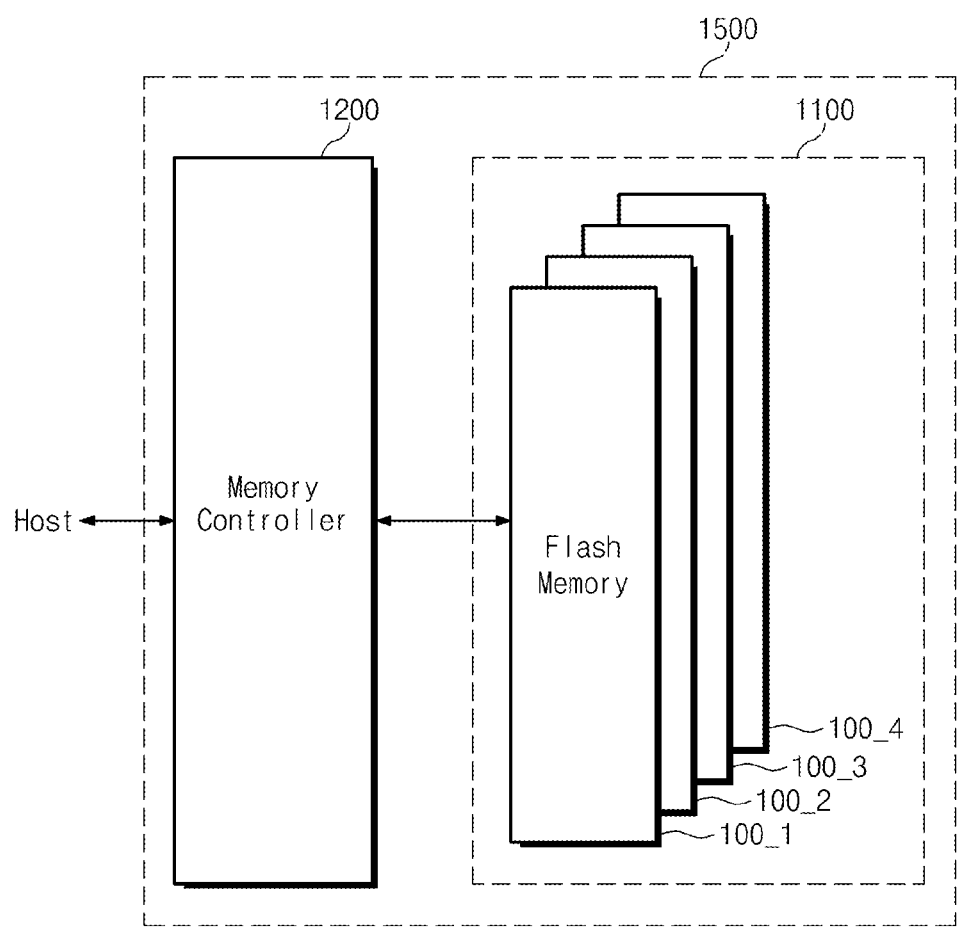
FIG. 26 is a block diagram illustrating a data storage device including a flash memory device according to an exemplary embodiment of the inventive concept.

FIG. 26 is a block diagram illustrating a data storage device including a flash memory device according to an exemplary embodiment of the inventive concept.

Referring to FIG. 26, a data storage device 1500 can be controlled by a host. For example, the host may include a handheld electronic device such as a personal/handheld computer, a personal digital assistant (PDA), a portable media player (PMP), an MP3 player, and the like. The host and the data storage device 1500 may be connected by the standardized interface such as the USB, SCSI, ESDI, SATA, SAS, PCI-express, or IDE interface. An interface manner of connecting the host and the data storage device 1500 may be implemented variously without limitation to a specific manner.

The data storage device 1500 may be formed of a solid state disk or drive (SSD). However, the inventive concept is not limited thereto. For example, the data storage device 1500 may be integrated in a single semiconductor device to form a PC (PCMCIA) card, a CF card, an SM (or, SMC) card, a memory stick, a multimedia card (MMC, RS-MMC, MMC-micro), a security card (SD, miniSD, microSD, SDHC), a universal flash storage (UFS) device, or the like.

The data storage device 1500 may include a memory controller 1200 and a flash memory 1100 as a main storage part. The memory controller 1200 may be configured to control read, write, and erase operations of the flash memory 1100 in response to a request from the host.

The flash memory 1100 may be formed of a plurality of nonvolatile memory chips (e.g., flash memory chips) 100_1 to 100_4. The flash memory chips 100_1 to 100_4 may perform a read/write/erase operation according to a request from the host provided via a corresponding channel, respectively.

Each of the flash memory chips 100_1 to 100_4 may have the same constitution and operation as that in FIG. 1. For example, each of the flash memory chips 100_1 to 100_4 may use a conductive floating gate surrounded by an insulation film as a charge storage layer. Further, each of the flash memory chips 100_1 to 100_4 may use an insulation film such as $Si_3N_4$, $Al_2O_3$, HfAlO, HfSiO, etc. as a charge storage layer instead of a typical conductive floating gate. The flash memory according to an exemplary embodiment of the inventive concept may be implemented to have one of a stack flash structure having a multi-layered array, a source-drain free flash structure, a pin-type flash structure, and a three-dimensional (or, vertical-type) flash structure.

Each of the flash memory chips 100_1 to 100_4 may be implemented to include all characteristics associated with negative voltage generation of the inventive concepts described in FIGS. 10 to 23. For example, each of the flash memory chips 100_1 to 100_4 may be configured to successively generate a plurality of negative voltages as a voltage to be applied to a word line. In particular, each of the flash memory chips 100_1 to 100_4 may be configured to convert a level of a negative voltage rapidly. In more detail, when a first negative voltage is generated and then a second negative voltage higher in level than the first negative voltage is generated, a previously generated voltage (i.e., the first negative voltage) may be discharged, for example, to a level rapidly. And then, a negative charge pumping operation may be performed during a time Ref PT to generate the second negative voltage. In this case, it is possible to optimize a period for generating a negative voltage in time. This means that a required level of a negative voltage is generated within a rapid time.

In another embodiment, each of the flash memory chips 100_1 to 100_4 may be configured to adjust a generation order of negative voltages according to a level of a negative voltage to be generated or to adjust a voltage generation order such that a negative voltage and a positive voltage are generated in turn. In this case, it is possible to minimize a delay time caused at a transition from a first negative voltage to a second negative voltage without a discharge operation or a word line recovery operation. This means that a required level of a negative voltage is generated within a rapid time.

A negative voltage generating method is exemplarily described under the condition that negative verification voltages are generated in sequence. However, the negative voltage generating method may be applied to various negative voltages (e.g., various negative word line voltages) and various positive word line voltages without limitation to a specific negative voltage (e.g., a verification voltage, a read voltage, etc.). According to a word line voltage generating method of the inventive concept, level conversion may be made with respect to negative and positive word line voltages rapidly. This may enable a program time to be reduced. Further, it is possible to efficiently perform read and verify operations about a data state distributed at negative and positive voltage regions.

Figure 27:
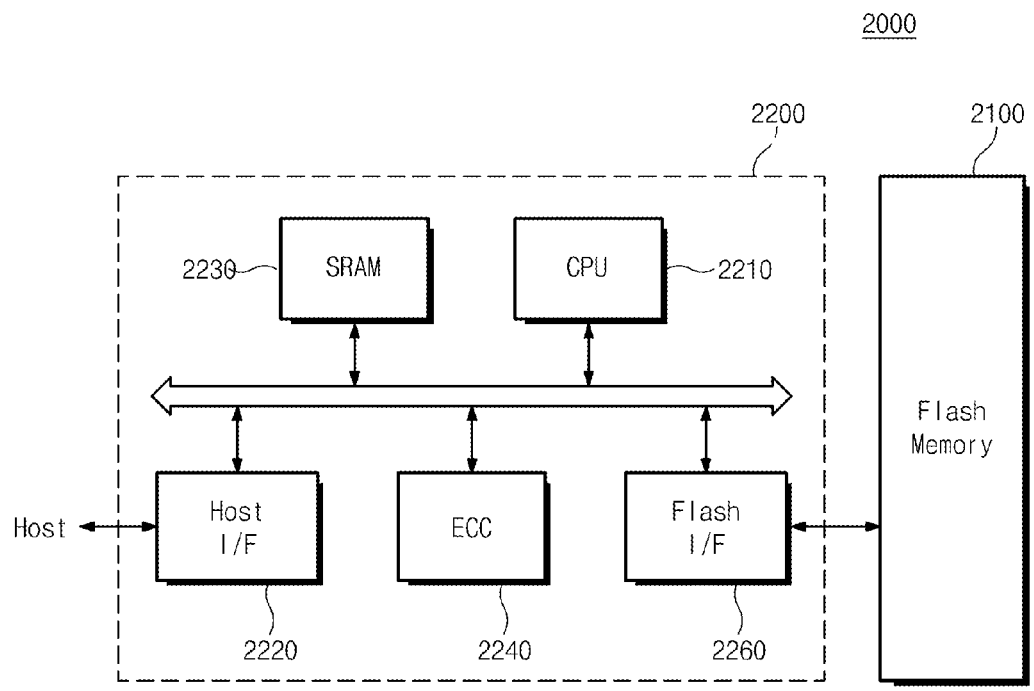
FIG. 27 is a block diagram illustrating a data storage device according to another exemplary embodiment of the inventive concept.

FIG. 27 is a block diagram illustrating a data storage device according to another exemplary embodiment of the inventive concept.

Referring to FIG. 27, a data storage device 2000 may include a memory controller 2200 and a flash memory 2100.

The flash memory 2100 may be substantially identical to that in FIG. 1. The flash memory 2100 may be implemented to have one of a stack flash structure having a multi-layered array, a source-drain free flash structure, a pin-type flash structure, and a three-dimensional (or, vertical-type) flash structure. The flash memory 2100 may be implemented to include all characteristics associated with negative voltage generation of the inventive concepts described in FIGS. 10 to 23, and description thereof is thus omitted.

The memory controller 2200 may be configured to control the flash memory 2100. The memory controller 2200 may be identical to that illustrated in FIGS. 1 to 26.

An SRAM 2230 may be used as a working memory. A host interface 2220 may include the data exchange protocol of a host connected with the data storage device 2000. An ECC circuit 2240 may be configured to detect and correct an error of data read out from the flash memory 2100. A memory interface 2260 may be configured to interface with the flash memory 2100 according to an exemplary embodiment of the inventive concept. A CPU 2210 may be configured to perform an overall control operation for exchanging data. Although not shown, the data storage device 2000 may further include a ROM which stores code data for interfacing with a host.

In this embodiment, the data storage device 2000 may be applied to one of various user devices such as computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting a home network, one of various electronic devices constituting a computer network, one of various electronic devices constituting a telematics network, RFID, or one (e.g., SSD, a memory card, etc.) of various electronic devices constituting a computing system.

Figure 28:
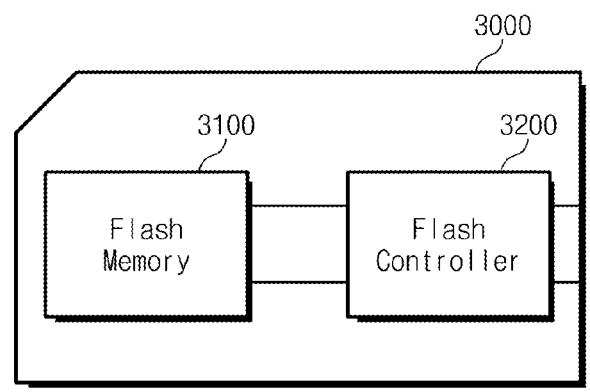
FIG. 28 is a block diagram illustrating a data storage device according to still another exemplary embodiment of the inventive concept.

FIG. 28 is a block diagram illustrating a data storage device according to still another exemplary embodiment of the inventive concept.

Referring to FIG. 28, a data storage device 3000 may include a flash memory 3100 and a flash controller 3200. The flash controller 3200 may control the flash memory 3100 in response to control signals received from the outside of the data storage device 3000. The flash controller 3200 may be substantially identical to those in FIGS. 26 and 27, and description thereof is thus omitted.

Further, the flash memory 3100 may be identical to that in FIG. 1, and may be implemented to have one of a stack flash structure having a multi-layered array, a source-drain free flash structure, a pin-type flash structure, and a three-dimensional (or, vertical-type) flash structure. The flash memory 3100 in FIG. 28 may be implemented to include all characteristics associated with negative voltage generation of the inventive concepts described in FIGS. 10 to 23, and description thereof is thus omitted.

The data storage device 3000 may be a memory card device, an SSD device, a multimedia card device, an SD device, a memory stick device, a HDD device, a hybrid drive device, or a USB flash device. For example, the data storage device 3000 may be a card satisfying the industrial standard for using a user device such as a digital camera, a personal computer, etc.

Figure 29:
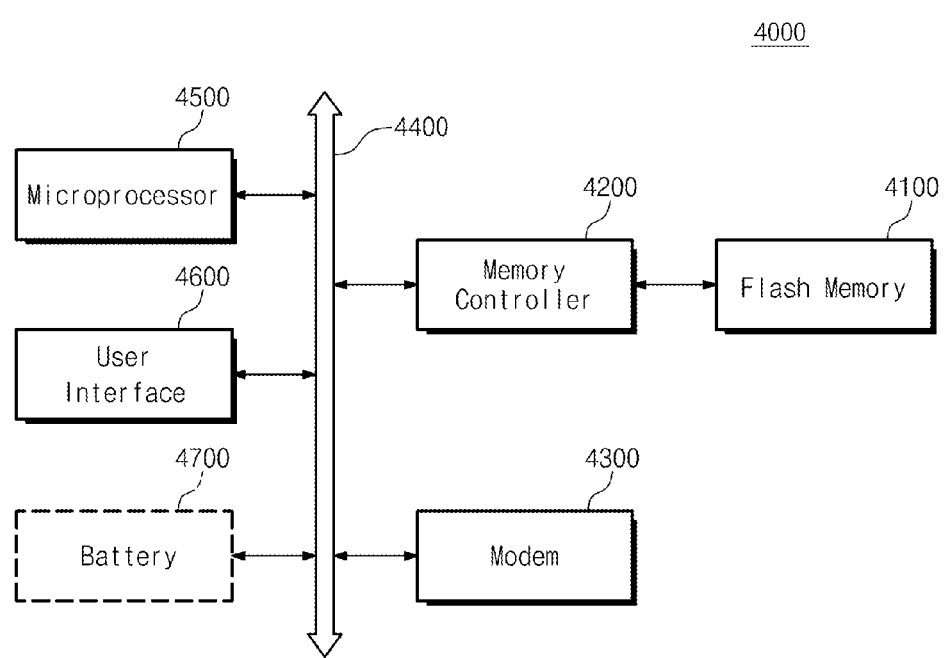
FIG. 29 is a block diagram illustrating a computing system including a flash memory device according to an exemplary embodiment of the inventive concept.

FIG. 29 is a block diagram illustrating a computing system including a flash memory device according to an exemplary embodiment of the inventive concept.

Referring to FIG. 29, a computing system 4000 may include a flash memory device 4100, a memory controller 4200, a modem 4300 such as a baseband chipset, a microprocessor 4500, and a user interface 4600. The elements 4200, 4300, 4500, and 4600 may be electrically connected with a bus 4400. The flash memory device 4100 may be substantially identical to that in FIG. 1, and may be implemented to have one of a stack flash structure having a multi-layered array, a source-drain free flash structure, a pin-type flash structure, and a three-dimensional (or, vertical-type) flash structure. The flash memory device 4100 in FIG. 29 may be implemented to include all characteristics associated with negative voltage generation of the inventive concepts described in FIGS. 10 to 23, and description thereof is thus omitted.

In the event that the computing system 4000 is a mobile device, it may further comprise a battery 4700 for powering the computing system 4000. Although not shown, the computing system 4000 may further include an application chipset, a camera image processor (CIS), a mobile DRAM, and the like. The memory controller 4200 and the flash memory device 4100 may constitute a solid state drive/drive (SSD) which uses a nonvolatile memory to store data, for example.

In some embodiments, a nonvolatile memory device and/or a memory controller may be packed by various types of packages such as PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A word line voltage generating method of a flash memory comprising:
   generating a program voltage using a positive voltage generator;
   generating a plurality of negative program verification voltages corresponding to a plurality of negative data states using a negative voltage generator; and
   generating at least one or more program verification voltages corresponding to at least one or more states using the positive voltage generator,
   wherein said generating a plurality of negative program verification voltages comprises
   generating a first negative verification voltage,
   discharging an output of the negative voltage generator to become higher than the first negative verification voltage, and
   performing a negative charge pumping operation until an output of the negative voltage generator reaches a second negative verification voltage level.

2. The word line voltage generating method of claim 1, wherein a discharged level of the output of the negative voltage generator is higher than that of the first negative verification voltage and identical to or lower than that of a ground voltage.

3. The word line voltage generating method of claim 1, wherein the first negative verification voltage is lower than the second negative verification voltage.

4. A word line voltage generating method of a flash memory comprising:
   generating a plurality of negative read voltages corresponding to a plurality of negative data states using a negative voltage generator; and
   generating at least one or more positive read voltages corresponding to at least one or more positive data states using a low voltage generator,
   wherein said generating a plurality of negative read voltages comprises
   generating a first negative read voltage,
   discharging an output of the negative voltage generator to become higher than the first negative read voltage, and
   performing a negative charge pumping operation until an output of the negative voltage generator reaches a second negative read voltage level.

5. The word line voltage generating method of claim 4, wherein a discharged level of the output of the negative voltage generator is higher than that of the first negative read voltage and identical to or lower than that of a ground voltage.

6. The word line voltage generating method of claim 4, wherein the first negative read voltage is lower than the second negative read voltage.

7. A word line voltage generating method of a flash memory comprising:
   generating a first negative voltage via a negative charge pumping of a negative voltage pump;
   discharging an output of the negative voltage pump;
   comparing the discharge output of the negative voltage pump with a second negative voltage that is a target negative voltage; and
   if the discharge output of the negative voltage pump is higher than the second negative voltage, activating the negative charge pumping to generate the second negative voltage,
   wherein the negative charge pumping of the negative voltage pump is activated until the discharge output of the negative voltage pump is identical to or lower than the second negative voltage.

8. The word line voltage generating method of claim 7, wherein the negative charge pumping is performed when a discharge result or a negative charge pumping result indicates that the output of the negative charge pump is higher than the target negative voltage.

9. The word line voltage generating method of claim 7, wherein the negative charge pumping is performed when a discharge result or a negative charge pumping result indicates that the output of the negative charge pump is higher than the target negative voltage and identical to or lower than a ground voltage.

10. The word line voltage generating method of claim 7, wherein said discharging of the negative charge pump is performed until the output of the negative charge pump reaches a predetermined negative voltage level.

11. The word line voltage generating method of claim 7, wherein said discharging of the negative charge pump is performed during a predetermined time responsive to control by control logic.

12. A flash memory device comprising:
    a memory cell array including a plurality of flash memory cells disposed at intersections of a plurality of word lines and a plurality of bit lines;
    a voltage generating unit configured to generate a plurality of word line voltages to be applied to the word lines; and
    a control logic configured to control a voltage generating operation of the voltage generating unit,
    wherein the voltage generating unit includes a negative voltage generator which is configured to generate a first negative voltage, to discharge the first negative voltage, and to perform a negative charge pumping until a second negative voltage higher than the first negative voltage is generated.

13. The flash memory device of claim 12, wherein an output of the negative voltage generator after the discharge of the first negative voltage is higher than the second negative voltage and identical to or lower than a ground voltage.

14. The flash memory device of claim 12, wherein when a third negative voltage lower than the first negative voltage is generated after generation of the first negative voltage, the negative voltage generator performs a negative charge pumping until an output of the negative voltage generator reaches the third negative voltage.

15. The flash memory device of claim 12, wherein the negative voltage generator comprises:
   a DC voltage generator configured to generate a DC voltage;
   a reference voltage generator configured to generate a reference voltage corresponding to a target negative voltage;
   an oscillator configured to generate a first clock;
   a negative charge pump configured to perform the negative charge pumping in response to a second clock and to generate the target negative voltage as a negative charge pumping result; and
   a voltage detector configured to compare the target negative voltage and the reference voltage responsive to the DC voltage, the reference voltage, and the first clock and to generate the second clock according to a comparison result.

16. The flash memory device of claim 15, wherein the voltage detector comprises:
   a power supply part configured to provide supply of the DC voltage to a comparison node responsive to a negative voltage enable signal;
   a voltage division part connected between the comparison node and a detection node and configured to divide the DC voltage, the detection node being supplied with the target negative voltage;
   a discharge part connected between the detection node and a ground terminal and configured to discharge a voltage of the detection node responsive to an inverted version of the negative voltage enable signal;
   a comparison part configured to compare a voltage of the comparison node and the reference voltage and to generate the second clock as a comparison result; and
   a control part configured to determine an activation of the power supply part and the discharge part responsive to the negative voltage enable signal.

17. The flash memory device of claim 16, wherein the control part deactivates the discharge part when a voltage of the detection node is higher than the reference voltage and identical to or lower than a ground voltage according to a discharge of the discharge part.

18. The flash memory device of claim 16, wherein the control part deactivates the discharge part after a discharge operation of the discharge part is performed during a predetermined time.

19. The flash memory device of claim 15, wherein the negative voltage generator is configured to generate a negative voltage for a word line corresponding to the target negative voltage based upon the DC voltage, the reference voltage, and the target negative voltage generated from the negative charge pump, and
   wherein the negative voltage generator includes a discharge part which is configured to discharge the negative voltage responsive to an inverted negative voltage enable signal.

20. The flash memory device of claim 12, wherein the memory cell array includes a three-dimensional memory cell array which has a plurality of word line plates electrically isolated from one another and a plurality of active pillars arranged to cross the plurality of word line plates.

21. A flash memory device comprising:
   a memory cell array including a plurality of flash memory cells disposed at intersections of a plurality of word lines and a plurality of bit lines;
   a positive voltage generator configured to generate a positive high voltage to be applied to a selected word line and at least one or more positive low voltages corresponding to at least one or more data states;
   a negative voltage generator configured to generate a plurality of negative voltages corresponding to a plurality of negative data states and to be applied to the selected word line; and
   a control logic configured to control the positive voltage generator and the negative voltage generator,
   wherein when a second negative voltage is generated after generation of a first negative voltage lower than the second negative voltage, the negative voltage generator discharges an output of the negative voltage generator so as to become higher than the second negative voltage, and performs a negative charge pumping until an output of the negative voltage generator reaches the second negative voltage.

22. The flash memory device of claim 21, wherein the memory cell array includes a three-dimensional memory cell array which has a plurality of word line plates electrically isolated from one another and a plurality of active pillars arranged to cross the plurality of word line plates.

23. A data storage device comprising:
   a plurality of flash memories connected with a plurality of channels; and
   a controller configured to control read, write, and erase operations of each of the plurality of flash memories via corresponding channels,
   wherein each of the plurality of flash memories comprises
   a memory cell array including a plurality of flash memory cells disposed at intersections of a plurality of word lines and a plurality of bit lines,
   a voltage generating unit configured to generate a plurality of word line voltages to be applied to the word lines, and
   a control logic configured to control a voltage generating operation of the voltage generating unit,
   wherein the voltage generating unit includes a negative voltage generator which is configured to generate a first negative voltage, to discharge the first negative voltage, and to generate a second negative voltage via a negative charge pumping.

24. The data storage device of claim 23, wherein the data storage device is one selected from a group of a solid state drive, a PCMCIA card, a compact flash card, a smart media card, a memory stick, a multimedia card, an SD card, and a USB flash storage device.

25. The data storage device of claim 23, wherein at least one of the plurality of flash memories is a three-dimensional memory cell array which has a plurality of word line plates electrically isolated from one another and a plurality of active pillars arranged to cross the plurality of word line plates.

26. A word line voltage generating method of a flash memory device comprising:
   generating a program voltage using a positive voltage generator;
   generating a plurality of negative program verification voltages using a negative voltage generator; and
   generating at least one or more positive program verification voltages using the positive voltage generator,
   wherein said generating a plurality of negative program verification voltages comprises generating a negative program verification voltage having a high level prior to a negative program verification voltage having a low level.

27. The word line voltage generating method of claim 26, wherein each of the plurality of negative program verification voltages is generated without performing a discharge operation or a word line recovery operation on a previously generated negative program verification voltage.

28. A word line voltage generating method of a flash memory device comprising:
generating a program voltage; and
generating a first negative program verification voltage, generating at least one positive program verification voltage corresponding to at least one data state, and generating a second negative program verification voltage, during a program verify operation of a cell of the flash memory device programmed with the generated program voltage.

29. The word line voltage generating method of claim 28, wherein the second negative program verification voltage is generated without performing a discharge operation or a word line recovery operation on the first negative program verification voltage.

30. The word line voltage generating method of claim 28, wherein the first negative program verification voltage has a negative voltage level higher than the second negative program verification voltage.

31. The word line voltage generating method of claim 28, wherein the first negative program verification voltage has a negative voltage level lower than the second negative program verification voltage.

32. A flash memory device comprising:
a memory cell array including a plurality of flash memory cells disposed at intersections of a plurality of word lines and a plurality of bit lines;
a voltage generating unit configured to generate a plurality of word line voltages to be applied to the word lines; and
a control logic configured to control a voltage generating operation of the voltage generating unit,
wherein the voltage generating unit generates a plurality of negative word line voltages sequentially from a negative word line voltage having a highest level to a negative word line voltage having a lowest level as program verification voltages during a programming verify operation.

33. The flash memory device of claim 32, wherein the plurality of negative word line voltages are generated without performing a discharge operation or a word line recovery operation on a previously generated negative word line voltage.

34. A flash memory device comprising:
a memory cell array including a plurality of flash memory cells disposed at intersections of a plurality of word lines and a plurality of bit lines;
a voltage generating unit configured to generate a plurality of word line voltages to be applied to the word lines; and
a control logic configured to control a voltage generating operation of the voltage generating unit,
wherein the voltage generating unit generates two different negative word line voltages and a positive word line voltage in turn during a program verify operation.

35. The flash memory device of claim 34, wherein the plurality of negative word line voltages are generated without performing a discharge operation or a word line recovery operation on a previously generated negative word line voltage.

36. A word line voltage generating method of a flash memory comprising:
generating a first negative verification voltage via a negative charge pumping of a negative voltage generator;
discharging an output of the negative voltage generator during a first discharge time; and
generating a second negative verification voltage via a negative charge pumping of the negative voltage generator after the first discharge time,
wherein the first discharge time is determined according to a voltage difference between the first negative verification voltage and the second negative verification voltage.

37. The word line voltage generating method of claim 36, wherein during said discharging, an output of the negative voltage generator is discharged to a level higher than the second negative verification voltage and identical to or lower than a ground voltage.

38. The word line voltage generating method of claim 36, wherein said discharging is skipped when the second negative verification voltage is lower than the first negative verification voltage.

39. The word line voltage generating method of claim 36, further comprising:
discharging an output of the negative voltage generator during a second discharge time that is shorter than the first discharge time, when at least one positive program verification voltage is generated after generation of the second negative verification voltage.

40. The word line voltage generating method of claim 39, wherein an output of the negative voltage generator is discharged to a ground level during the second discharge time.

41. A verification voltage generating method of a flash memory device which includes a negative voltage generator, comprising:
generating a first negative verification voltage via the negative voltage generator;
discharging an output of the negative voltage generator during a first discharge time;
generating a second negative verification voltage higher than the first negative verification voltage via the negative voltage generator;
discharging an output of the negative voltage generator during a second discharge time; and
generating a third negative verification voltage higher than the second negative verification voltage via the negative voltage generator.

42. The verification voltage generating method of claim 41, wherein the first discharge time is determined according to a voltage difference between the first and second negative verification voltages, and the second discharge time is determined according to a voltage difference between the second and third negative verification voltages.

43. The verification voltage generating method of claim 42, wherein the first discharge time increases as a voltage difference between the first and second negative verification voltages becomes large, and the second discharge time increases as a voltage difference between the second and third negative verification voltages becomes large.

44. The verification voltage generating method of claim 41, wherein the first and second negative verification voltages are verification voltages for a same negative data state.

45. A verification voltage generating method of a flash memory comprising:
generating a first negative verification voltage via a negative charge pumping operation of a negative voltage generator; and generating a second negative verification voltage higher than the first negative verification voltage without the negative charge pumping operation,
wherein the second negative verification voltage is set up according to a discharge of the negative voltage generator.

46. The verification voltage generating method of claim 45, wherein the second negative verification voltage is set up via a natural discharge or a forced discharge on an output terminal of the negative voltage generator.

47. A verification voltage generating method of a flash memory device which includes a positive voltage generator and a negative voltage generator, comprising:
generating a negative verification voltage using the negative voltage generator;
discharging an output of the negative voltage generator to a ground level; and
generating a positive verification voltage via a positive charge pumping operation of the positive voltage generator.

48. The verification voltage generating method of claim 47, wherein the negative verification voltage and the positive verification voltage correspond to adjacent threshold voltage distributions, respectively.

49. A flash memory device comprising:
a memory cell array including a plurality of flash memory cells disposed at intersections of a plurality of word lines and a plurality of bit lines;
a voltage generating unit configured to generate a plurality of word line voltages to be applied to the word lines; and
a control logic configured to control a voltage generating operation of the voltage generating unit,
wherein the voltage generating unit discharges a first negative voltage during a discharge time and then generates a second negative voltage higher than the first negative voltage, and
wherein the discharge time is determined according to a voltage difference between the first negative voltage and the second negative voltage.

50. The flash memory device of claim 49, wherein when a discharge operation is executed during the discharge time, an output voltage of the voltage generating unit is higher than the second negative voltage and identical to or lower than a ground voltage.

51. The flash memory device of claim 49, wherein the voltage generating unit comprises:
a DC voltage generator configured to generate a DC voltage;
a reference voltage generator configured to generate a reference voltage corresponding to a target negative voltage to be generated among the first and second negative voltages;
an oscillator configured to generate a first clock;
a negative charge pump configured to perform a negative charge pumping in response to a second clock and to generate the target negative voltage as a negative charge pumping result; and
a voltage detector configured to compare the target negative voltage and the reference voltage in response to the DC voltage, the reference voltage, and the first clock, and to generate the second clock according to a comparison result.

52. The flash memory device of claim 51, wherein the voltage detector comprises:
a power supply part configured to provide supply of the DC voltage to a comparison node responsive to a negative voltage enable signal;
a voltage division part connected between the comparison node and a detection node and configured to divide the DC voltage, the detection node being supplied with the target negative voltage;
a discharge part connected between the detection node and a ground terminal and configured to discharge a voltage of the detection node responsive to an inverted version of the negative voltage enable signal;
a comparison part configured to compare a voltage of the comparison node and the reference voltage and to generate the second clock as a comparison result; and
a control part configured to determine an activation of the power supply part and the discharge part responsive to the negative voltage enable signal.

53. The flash memory device of claim 52, wherein the control part deactivates the discharge part after the discharge operation is performed during a predetermined time.

54. A data storage device comprising:
a plurality of flash memories connected with a plurality of channels; and
a controller configured to control read, write, and erase operations of each of the plurality of flash memories via corresponding channels,
wherein each of the plurality of flash memories comprises a memory cell array including a plurality of flash memory cells disposed at intersections of a plurality of word lines and a plurality of bit lines,
a voltage generating unit configured to generate a plurality of word line voltages to be applied to the word lines, and
a control logic configured to control a voltage generating operation of the voltage generating unit,
wherein the voltage generating unit includes a negative voltage generator, and
wherein when a first negative voltage is generated and then a second negative voltage higher than the first negative voltage is generated, the negative voltage generator discharges an output terminal of the voltage generating unit during a discharge time determined according to a voltage difference between the first negative voltage and the second negative voltage, and then generates the second negative voltage.

55. The data storage device of claim 54, wherein the data storage device is one selected from a group of a solid state drive, a PCMCIA card, a compact flash card, a smart media card, a memory stick, a multimedia card, an SD card, and a USB flash storage device.

* * * * *